United States Patent
Kim et al.

(10) Patent No.: US 10,996,242 B2
(45) Date of Patent: May 4, 2021

(54) PROBE CARD AND TEST APPARATUS INCLUDING THE SAME

(71) Applicant: SAMSUNG ELECTRONICS CO., LTD., Suwon-si (KR)

(72) Inventors: Gyu-Yeol Kim, Hwaseong-si (KR); Shin-Ho Kang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 574 days.

(21) Appl. No.: 15/615,084

(22) Filed: Jun. 6, 2017

(65) Prior Publication Data
US 2018/0156842 A1 Jun. 7, 2018

(30) Foreign Application Priority Data
Dec. 7, 2016 (KR) .................. 10-2016-0166205

(51) Int. Cl.
*G01R 1/073* (2006.01)
*G01R 35/00* (2006.01)

(52) U.S. Cl.
CPC .......... *G01R 1/07342* (2013.01); *G01R 35/00* (2013.01)

(58) Field of Classification Search
CPC ............ G01R 1/07342; G01R 31/2884; G01R 31/2601; G01R 1/073; G01R 35/00; G01R 1/07307; G01R 1/07314; G01R 1/07321; G01R 31/2889; G01R 35/005; G01R 31/2891; G01R 31/2831; G01R 1/07357; H01R 12/714

See application file for complete search history.

(56) References Cited

U.S. PATENT DOCUMENTS

| | | | |
|---|---|---|---|
| 5,497,079 A | | 3/1996 | Yamada et al. |
| 5,673,477 A | * | 10/1997 | Hattori ............... G01R 1/07307 29/825 |
| 6,020,742 A | * | 2/2000 | Kano ..................... F02P 17/12 324/378 |
| 6,419,500 B1 | | 7/2002 | Kister |
| 6,530,148 B1 | * | 3/2003 | Kister ............... G01R 1/07357 29/840 |
| 6,717,420 B2 | | 4/2004 | Eyraud et al. |
| 7,068,056 B1 | | 6/2006 | Gibbs et al. |
| 7,102,371 B1 | * | 9/2006 | Tang .................. G01R 1/07364 324/754.11 |
| 7,180,318 B1 | * | 2/2007 | Mahoney ........... G01R 1/07314 324/756.03 |
| 7,675,836 B2 | | 3/2010 | Ishii et al. |
| 8,789,890 B2 | | 7/2014 | Iwata et al. |

(Continued)

*Primary Examiner* — Lee E Rodak
*Assistant Examiner* — Brent J Andrews
(74) *Attorney, Agent, or Firm* — F. Chau & Associates, LLC

(57) ABSTRACT

A probe card, for testing an electrical characteristic of a device under test (DUT) including a plurality of semiconductor devices, includes a substrate, a first probe pin disposed on a surface of the substrate and including a tip portion capable of contacting a pad of the DUT, and a second probe pin disposed on the surface of the substrate and including a tip portion capable of contacting the pad of the DUT. The first probe pin protrudes further than the second probe pin protrudes from the surface of the substrate in a first direction that is substantially perpendicular to the surface of the substrate.

18 Claims, 16 Drawing Sheets

(56) References Cited

U.S. PATENT DOCUMENTS

| | | | |
|---|---|---|---|
| 2002/0050832 A1* | 5/2002 | Aldaz | G01R 1/07342 |
| | | | 324/750.25 |
| 2008/0054261 A1* | 3/2008 | Song | G01R 31/2884 |
| | | | 257/48 |
| 2011/0121852 A1* | 5/2011 | Horii | G01R 31/2889 |
| | | | 324/756.03 |
| 2015/0054532 A1* | 2/2015 | Yoo | G01R 31/2879 |
| | | | 324/750.01 |
| 2016/0131700 A1 | 5/2016 | Kang et al. | |

* cited by examiner

US 10,996,242 B2

PROBE CARD AND TEST APPARATUS INCLUDING THE SAME

CROSS-REFERENCE TO RELATED APPLICATION

This application claims priority under 35 U.S.C. § 119 to Korean Patent Application No. 10-2016-0166205, filed on Dec. 7, 2016 in the Korean Intellectual Property Office, the disclosure of which is incorporated by reference herein in its entirety.

TECHNICAL FIELD

Exemplary embodiments of the inventive concept relate to a probe card and a test apparatus including the same, and in particular, to a probe card for testing an electrical characteristic of a device under test (DUT) including a plurality of semiconductor devices and a test apparatus including the same.

DISCUSSION OF RELATED ART

After manufacturing a plurality of semiconductor devices on a semiconductor wafer through a semiconductor manufacturing process, an electrical characteristic test on each of the plurality of semiconductor devices may be performed. The electrical characteristic test may be performed through a probe card. The probe card applies an electrical signal to the plurality of semiconductor devices on the semiconductor wafer and detects a signal output in response to the applied electrical signal to determine failures or malfunctions of the plurality of semiconductor devices. The probe card may be an interface between an electronic test system and the semiconductor wafer.

SUMMARY

According to an exemplary embodiment of the inventive concept, a probe card for testing an electrical characteristic of a device under test (DUT) including a plurality of semiconductor devices may include a substrate, a first probe pin, and a second probe pin. The first probe pin may be disposed on a surface of the substrate and may include a tip portion capable of contacting a pad of the DUT. The second probe pin may be disposed on the surface of the substrate and may include a tip portion capable of contacting the pad of the DUT. The first probe pin may protrude further than the second probe pin protrudes from the surface of the substrate in a first direction that is substantially perpendicular to the surface of the substrate.

According to an exemplary embodiment of the inventive concept, a test apparatus may include a tester configured to provide an input signal, a stage configured to support a wafer including a plurality of semiconductor devices, and a probe card configured to transmit the input signal to the wafer and to transmit an output signal, output from the wafer in response to the input signal, to the tester. The probe card may include a substrate, a first probe pin, and a second probe pin. The first probe pin and the second probe pin may be provided on a surface of the substrate and may be configured to be capable of contacting a pad of the wafer. The tester may be configured to test electrical characteristics of the plurality of semiconductor devices using the output signal and to inspect an over-abrasion status of the first probe pin.

According to an exemplary embodiment of the inventive concept, a test apparatus may include an input signal applying unit configured to provide an input signal, an output signal receiving unit configured to receive an output signal, and a probe card configured to transmit the input signal, provided from the input signal applying unit, to a wafer and to transmit the output signal, output from the wafer, to the output signal receiving unit. The probe card may include at least one input stage configured to receive the input signal, at least one output stage configured to transmit the output signal, a first probe pin configured to be capable of contacting a pad of the wafer, and a second probe pin configured to be capable of contacting the pad of the wafer. The first probe pin may have a first height. The second probe pin may have a second height that is smaller than the first height.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1A:
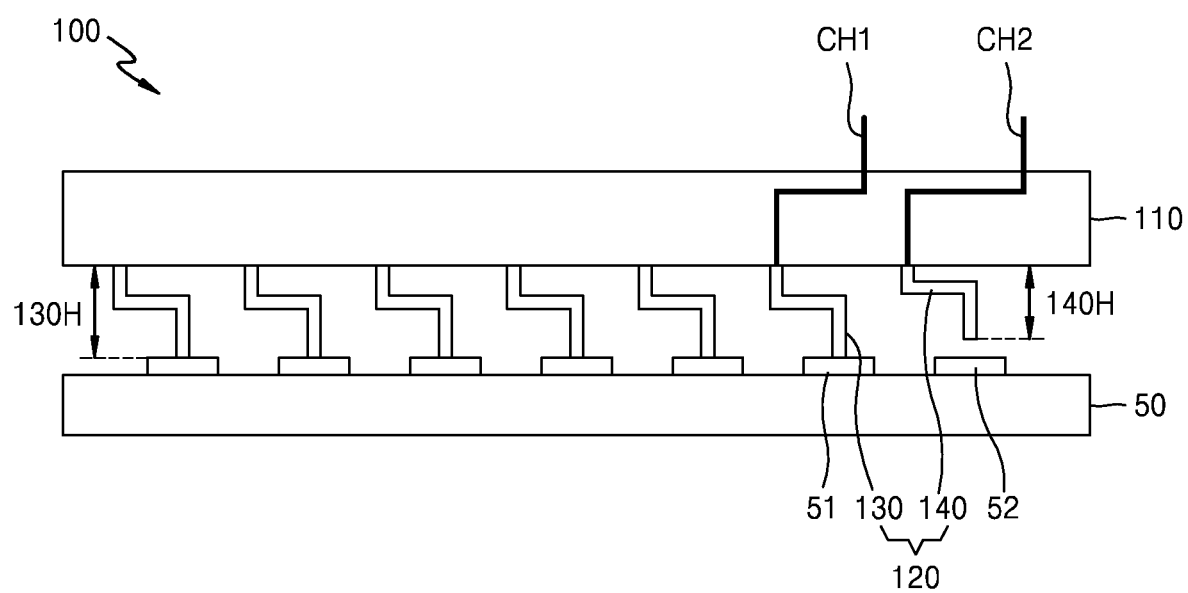
FIGS. 1A and 1B are schematic views illustrating a probe card according to an exemplary embodiment of the inventive concept.

Various exemplary embodiments will now be described more fully hereinafter with reference to the accompanying drawings. Like reference numerals may refer to like elements throughout this application.

Figure 1B:
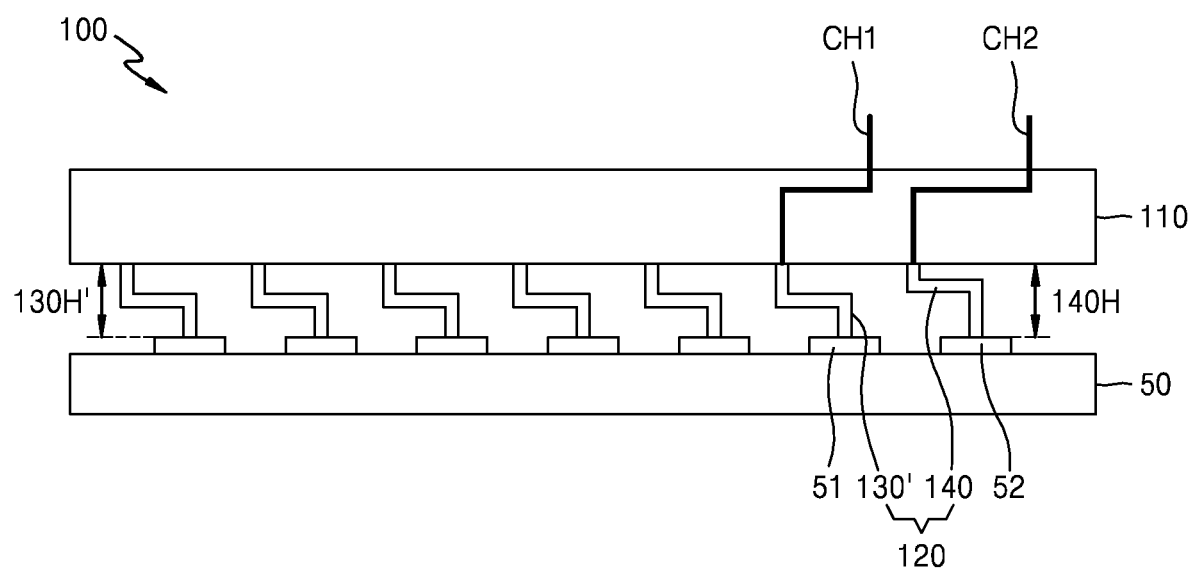
Figure 1C:
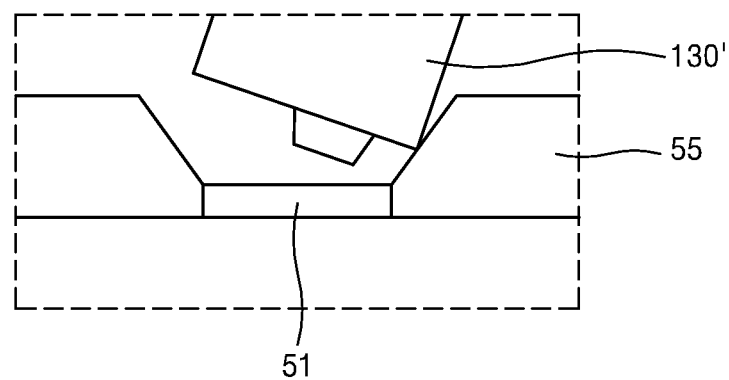
FIG. 1C is an enlarged view illustrating a portion of the probe card of FIG. 1B according to an exemplary embodiment of the inventive concept.

FIGS. 1A and 1B are schematic views illustrating a probe card according to an exemplary embodiment of the inventive concept. FIG. 1C is an enlarged view illustrating a portion of the probe card of FIG. 1B according to an exemplary embodiment of the inventive concept.

Referring to FIGS. 1A and 1B, a probe card 100 may include a substrate 110 and a probe pin 120 provided on a surface (e.g., a lower surface) of the substrate 110.

The probe card 100 may be provided to perform a test process for testing an electronic characteristic of a device under test (DUT) including a plurality of semiconductor devices. For example, the probe card 100 may be provided so that an electric signal is applied to the semiconductor devices formed on a wafer 50 and an electronic die sorting (EDS) process is performed to determine whether or not the semiconductor devices are defective by a signal output from the semiconductor devices in response to the applied electric signal. However, the inventive concept is not limited to the EDS process. For example, any test process may be performed to determine whether or not the semiconductor devices are defective.

As an example, the probe card 100 may apply an electric signal provided from a tester 200 (refer to FIG. 8), e.g., at least one of power or other signal, to the wafer 50 including the semiconductor devices, and may provide an electrical signal, corresponding to the applied electric signal, output from the wafer 50 to the tester 200. While performing this test process, the probe pin 120 may physically contact a pad on the wafer 50 to transmit the electrical signal to the wafer 50 or receive the electrical signal output from the wafer 50. The probe pin 120 may include a plurality of probe pins. At least one of the plurality of probe pins may be an input pin for transmitting the electric signal provided from the tester 200 to the wafer 50. At least one of the plurality of probe pins may be an output pin for receiving the electrical signal output from the wafer 50. The probe pin 120 may be referred to as a probe needle or a probe.

According to exemplary embodiments of the inventive concept, the probe card 100 may include a cantilever probe card, a vertical probe card, or a membrane probe card.

According to exemplary embodiments of the inventive concept, the probe card 100 may be a micro-electro-mechanical systems (MEMS) probe card.

The probe pin 120 may include a first probe pin 130 having a first height 130H and a second probe pin 140 having a second height 140H. The first height 130H of the first probe pin 130 may be different from the second height 140H of the second probe pin 140. The first probe pin 130 may be provided to test the electrical characteristics of the semiconductor devices, and the second probe pin 140 may be provided to detect whether or not the first probe pin 130 is defective.

According to exemplary embodiments of the inventive concept, the first probe pin 130 and the second probe pin 140 may protrude from the surface of the substrate 110 in a vertical (e.g., perpendicular) direction relative to the surface of the substrate 110. The first height 130H of the first probe pin 130 may be greater than the second height 140H of the second probe pin 140. One end of the first probe pin 130 may be positioned at a lower level relative to (e.g., closer to) a surface of the wafer 50 than one end of the second probe pin 140.

Hereinafter, whether or not the probe card 100 is defective during the test process, e.g., a method of detecting an over-abrasion status of the first probe pin 130, will described with respect to FIGS. 1A and 1B.

Referring to FIG. 1A, while the first probe pin 130 contacts a first pad 51 of the wafer 50, the second probe pin 140 may be spaced apart from a second pad 52 of the wafer 50.

Since the first probe pin 130 contacts the first pad 51 of the wafer 50, the first pad 51 may be electrically connected to a first test channel CH1. For example, the first probe pin 130 may receive a signal output from the first pad 51 and may transmit the output signal to the first test channel CH1, such that a signal for testing the electronic characteristics of a semiconductor device may be supplied to the tester 200.

Since the second probe pin 140 does not contact the second pad 52 of the wafer 50, the second pad 52 may not be connected to a second channel CH2, and thus, an open status may be formed in which the second pad 52 and the second channel CH2 are not electrically connected to each other. Accordingly, the second channel CH2 may provide an open signal to the tester 200.

Referring to FIG. 1B, a first probe pin 130' corresponds to the first probe pin 130 at a later time. As an end of the first probe pin 130' wears out, a first height 130H' of the first probe pin 130' may be substantially equal to the second height 140H of the second probe pin 140. While the first probe pin 130' contacts the first pad 51 of the wafer 50, the second probe pin 140 may contact the second pad 52 of the wafer 50 due to abrasion of the end of the first probe pin 130'. Thus, the second pad 52 may be electrically connected to the second channel CH2 to form a short circuit therebetween. Accordingly, the second test channel CH2 may provide a short-circuit signal to the tester 200. In other words, when the short-circuit signal is output through the second channel CH2, the first probe pin 130' may have substantially the same height as the second probe pin 140.

The signal supplied to the tester 200 through the second probe pin 140 may be changed according to an abrasion degree of the end of the first probe pin 130 (e.g., as illustrated by the first probe pin 130'). Accordingly, when detecting the signal output through the second channel CH2, the over-abrasion status of the first probe pin 130 may be detected.

To prevent an increase of contact resistance caused by a foreign material attached to the probe pin 120 and secure a stable contact between the probe pin 120 and the pad (e.g., the first pad 51) of the wafer 50, a needle polishing process in which an end of the probe pin 120 is polished may be periodically performed, according to an exemplary embodiment of the inventive concept.

However, referring to FIG. 1C, when the end of the first probe pin 130' wears out beyond a predetermined level due to the needle polishing process, the first probe pin 130' may contact a protection layer 55 around the first pad 51. Thus, the protection layer 55 may be damaged, which may damage the semiconductor device. Additionally, the semiconductor device, which is otherwise normal, may be determined to be defective, and thus, reliability of the test process may be lowered.

A method of periodically measuring a height of the probe pin 120 may be used to inspect an abrasion status of the end of the probe pin 120, but accuracy may be lowered due to a measurement error of a measurer. Alternatively, a method of determining a lifetime of the probe card 100 may be performed by estimating an abrasion degree of the probe pin 120 according to the number of times the needle polishing process has been performed, but the abrasion degree may be not accurately estimated due to various variables of the test process.

In the probe card 100 according to the exemplary embodiments of the inventive concept, the over-abrasion status of the first probe pin 130 may be accurately inspected, and thus, the probe card 100 may be effectively used, such that the electrical characteristics of the semiconductor device may be accurately tested. Accordingly, the probe card 100 may not be prematurely determined to be defective by over-estimating the abrasion state of the first probe pin 130 while the probe card 100 has remaining life. Additionally, due to accurate inspection of the first probe pin 130, an over-worn first probe pin 130 contacting the protection layer 55 around the first pad 51 due to under-estimation of the abrasion status of the first probe pin 130 may be avoided, thus increasing the reliability of the test process.

In the probe card 100 according to exemplary embodiments of the inventive concept, the over-abrasion status of the first probe pin 130 may be detected in real time during the test process even without a separate test on the probe card 100.

Figure 2A:
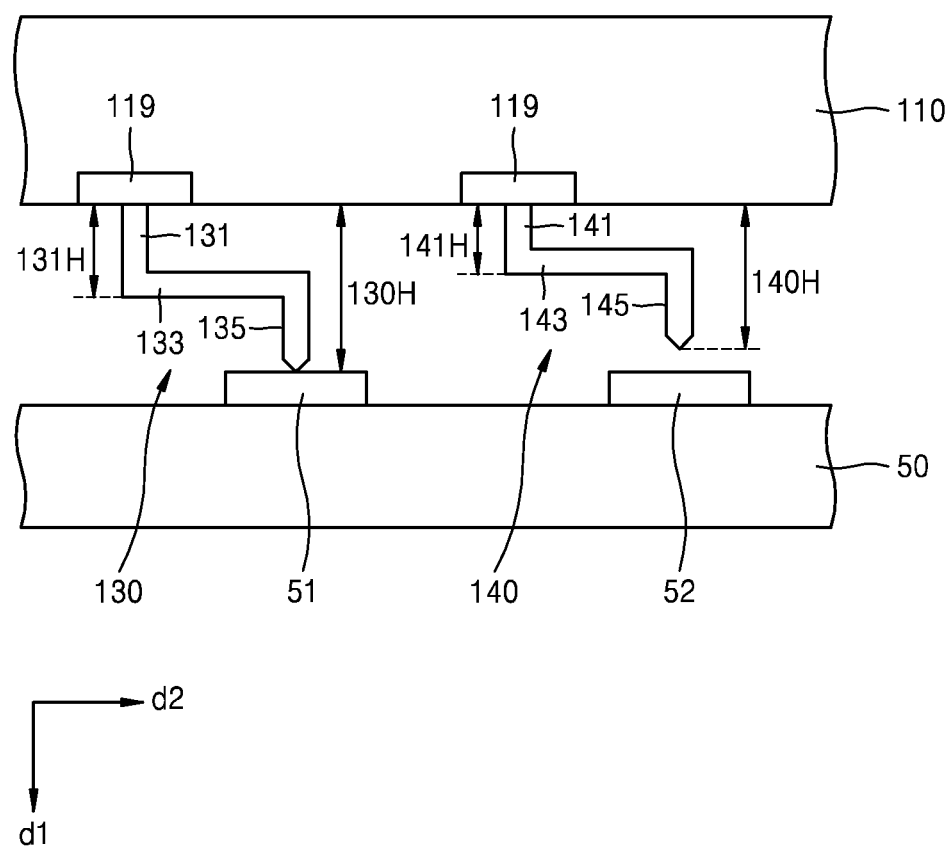
FIGS. 2A and 2B are schematic views illustrating the probe card of FIG. 1A according to exemplary embodiments of the inventive concept.
Figure 2B:
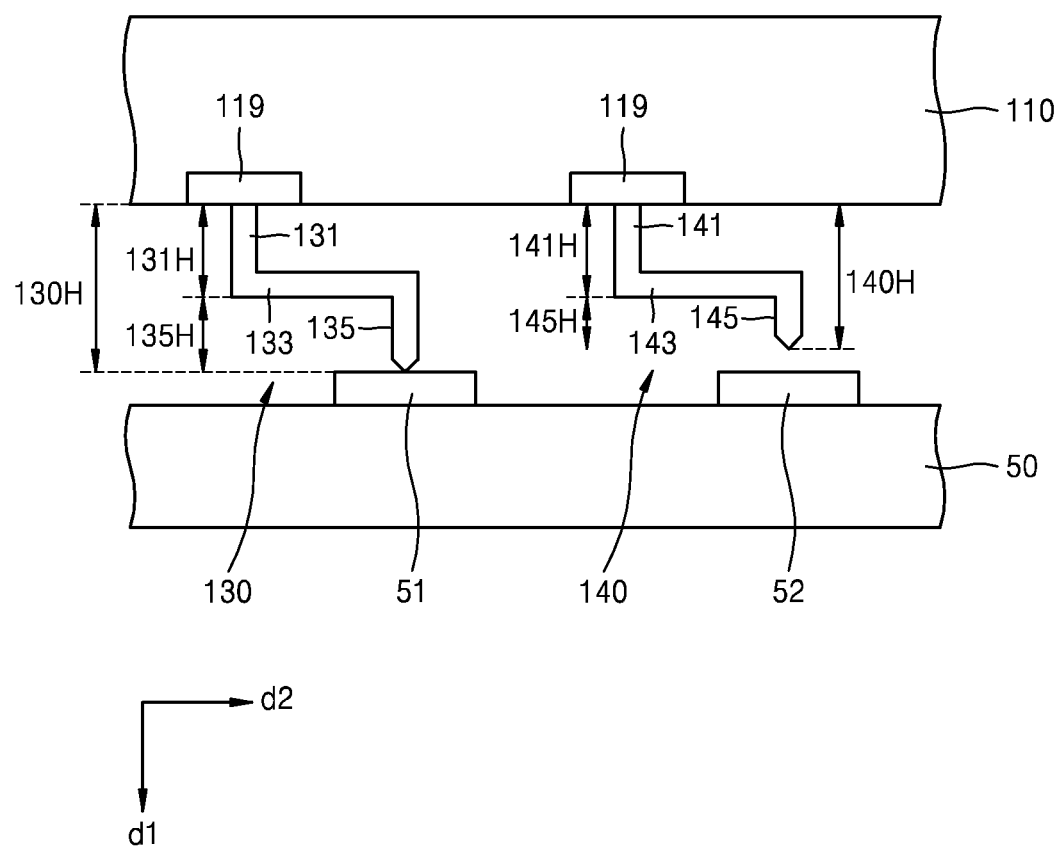

FIGS. 2A and 2B are schematic views illustrating the probe card of FIG. 1A according to exemplary embodiments of the inventive concept.

Referring to FIG. 2A, as described above, the probe card 100 may include the substrate 110, the first probe pin 130, and the second probe pin 140.

The first probe pin 130 may include a supporting portion 131, a connecting portion 133, and a tip portion 135. The second probe pin 140 may include a supporting portion 141, a connecting portion 143, and a tip portion 145. As described above, the first probe pin 130 may have the first height 130H greater than the second height 140H of the second probe pin 140.

The supporting portions 131 and 141 of the first and second probe pins 130 and 140, respectively, may be disposed on the surface of the substrate 110 to be electrically connected to an inner wiring line of the substrate 110 via a substrate pad 119. The supporting portions 131 and 141 may extend to a predetermined height from the surface of the substrate 110.

The tip portions 135 and 145 of the first and second probe pins 130 and 140, respectively, may be an end portion of its respective probe pin and may contact the first pad 51 and the second pad 52, respectively, of the wafer 50 to transmit an electrical signal between the probe card 100 and the wafer 50.

The tip portions 135 and 145 may be polished by the needle polishing process, as described above, to remove the foreign material attached thereon. A lower portion (or an end portion) of each of the tip portions 135 and 145 may be downwardly tapered as shown in FIG. 2A and may be sharp or rounded. However, the inventive concept is not limited thereto. For example, each of the tip portions 135 and 145 may have a flat lower surface.

The connecting portions 133 and 143 of the first and second probe pins 130 and 140, respectively, may connect the supporting portions 131 and 141 thereof and the tip portions 135 and 145 thereof. The connecting portions 133 and 143 may extend in a direction crossing an extension direction of the supporting portions 131 and 141. For example, the connecting portions 133 and 143 may extend in a direction perpendicular to the extension direction of the supporting portions 131 and 141, or may extend in a direction sloped at a predetermined angle to a direction perpendicular to the extension direction of the supporting portions 131 and 141. The connecting portions 133 and 143 may be deformed due to a load applied to the first and second probe pins 130 and 140 during the test process, and thus, overpressure may be prevented from being applied to the pad (e.g., the first pad 51) of the wafer 50.

According to exemplary embodiments of the inventive concept, a height 131H of the supporting portion 131 may be greater than a height 141H of the supporting portion 141. Alternatively, an extension length of the supporting portion 131 in a first direction d1 may be greater than an extension length of the supporting portion 141 in the first direction d1.

The first direction d1 may be, for example, a direction perpendicular to a second direction d2 that is parallel to the surface of the substrate 110.

In an initial state, the first height 130H of the first probe pin 130 may be greater than the second height 140H of the second probe pin 140. However, when the tip portion 135 of the first probe pin 130 is worn out to a predetermined level by the needle polishing process performed on the probe card 100, the first height 130H may become substantially equal to the second height 140H.

According to exemplary embodiments of the inventive concept, a difference between the first height 130H of the first probe pin 130 and the second height 140H of the second probe pin 140 may range from, for example, about 10 μm to about 100 μm, about 10 μm to about 70 μm, or about 10 μm to about 40 μm.

Referring to FIG. 2B, the first probe pin 130 may include the supporting portion 131, the connecting portion 133, and the tip portion 135, and the second probe pin 140 may include the supporting portion 141, the connecting portion 143, and the tip portion 145. A height 135H of the tip portion 135 of the first probe pin 130 may be greater than a height 145H of the tip portion 145 of the second probe pin 140. An extension length of the tip portion 135 in the first direction d1 may be greater than an extension length of the tip portion 145 in the first direction d1.

According to exemplary embodiments of the inventive concept, the difference between the first height 130H of the first probe pin 130 and the second height 140H of the second probe pin 140 may be substantially equal to a difference between the height 135H of the tip portion 135 of the first probe pin 130 and the height 145H of the tip portion 145 of the second probe pin 140.

Figure 3:
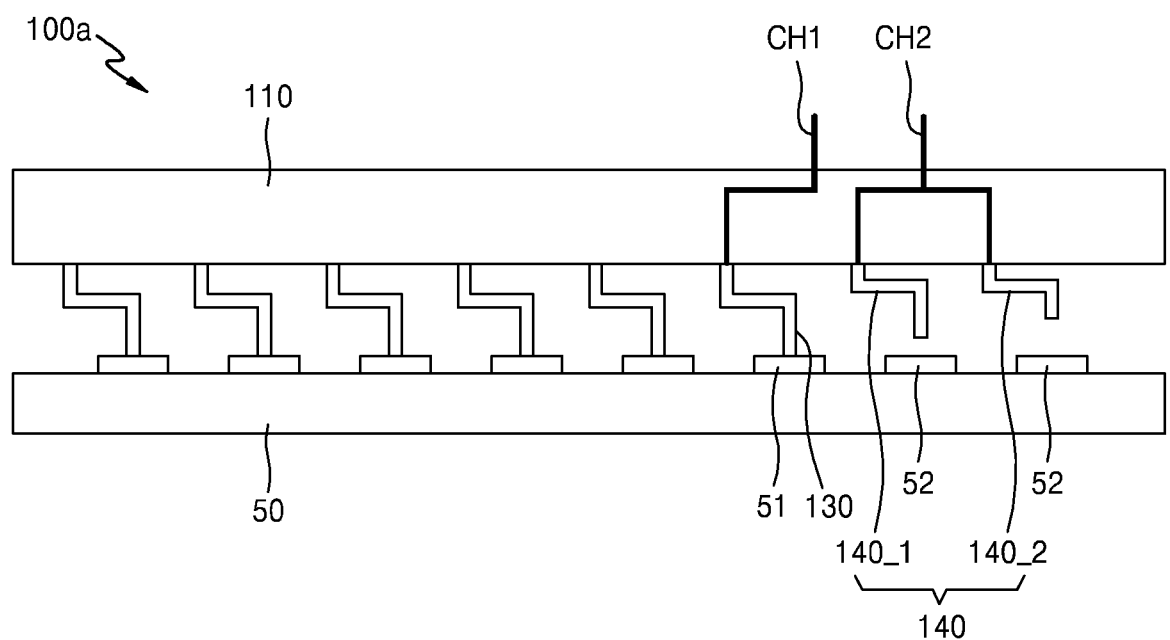
FIG. 3 is a schematic view illustrating a probe card according to an exemplary embodiment of the inventive concept.

FIG. 3 is a schematic view illustrating a probe card according to an exemplary embodiment of the inventive concept.

Referring to FIG. 3, a probe card 100a may include the substrate 110, the first probe pin 130 and the second probe pin 140. The second probe pin 140 may include a first sub-pin 140_1 and a second sub-pin 140_2 that have different heights.

A height of the first sub-pin 140_1 protruding from a surface (e.g. a lower surface) of the substrate 110 in a perpendicular direction relative to the surface of the substrate 110 may be greater than a height of the second sub-pin 140_2 protruding from the surface of the substrate 110 in the perpendicular direction.

For example, when the first sub-pin 140_1 contacts the second pad 52 of the wafer 50, a short circuit signal may be supplied to the tester 200 (refer to FIG. 8) via the second channel CH2, and thus, it may be recognized that the first probe pin 130 is worn out to have a height corresponding to the height of the first sub-pin 140_1. Further, when the second sub-pin 140_2 contacts the second pad 52, the short circuit signal may be supplied to the tester 200 via the second channel CH2, and thus, it may be recognized that the first probe pin 130 is worn out to have a height corresponding to the height of the second sub-pin 140_2.

Since the second probe pin 140 includes the sub-pins having different heights, a state of the first probe pin 130 may be progressively inspected while performing the test process, and thus the probe card 100a may be efficiently managed.

The second probe pin 140 may include the sub-pins having two different heights as shown in FIG. 3, but the inventive concept is not limited thereto. For example, the second probe pin 140 may include sub-pins having three or more different heights.

Figure 4A:
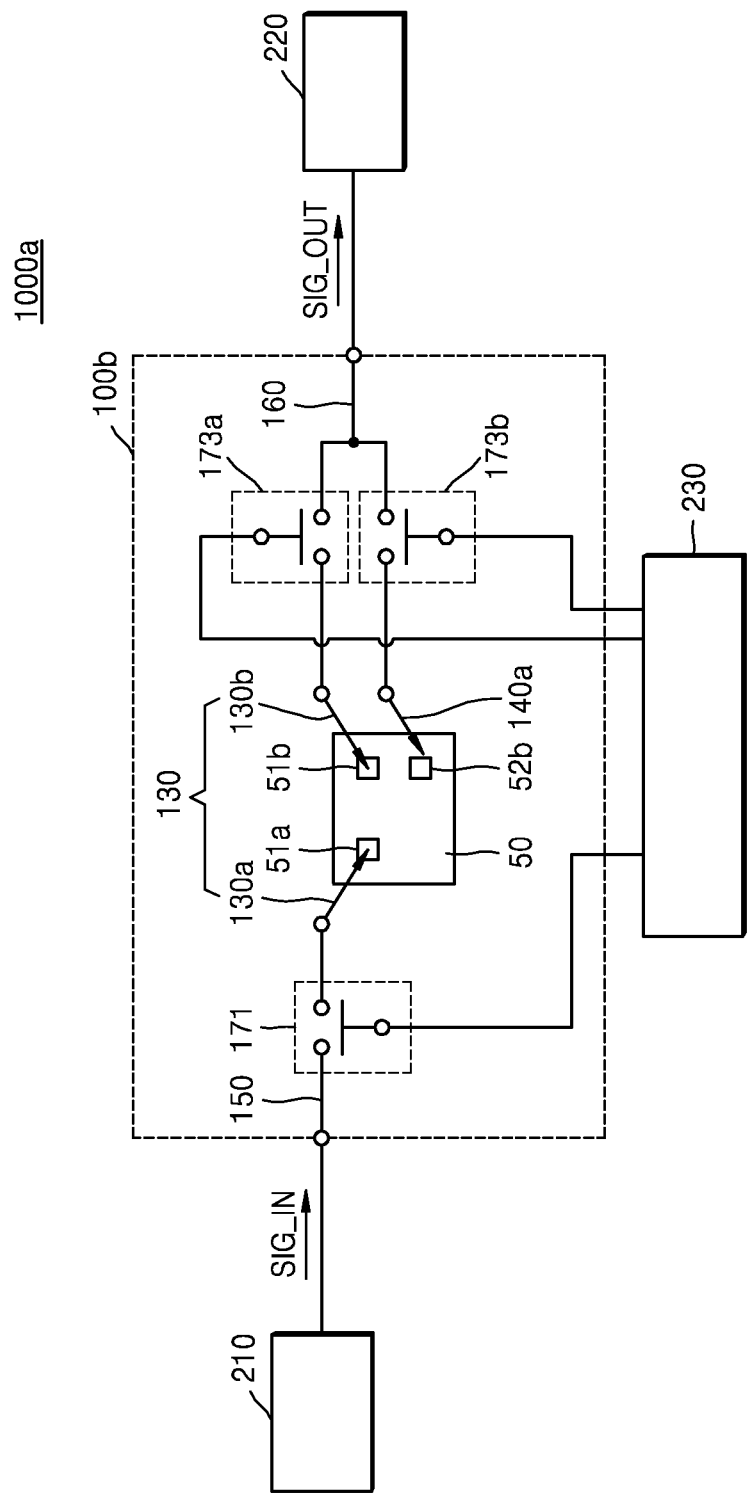
FIGS. 4A and 4B are schematic views illustrating a probe card and a test apparatus including the probe card according to an exemplary embodiment of the inventive concept.
Figure 4B:
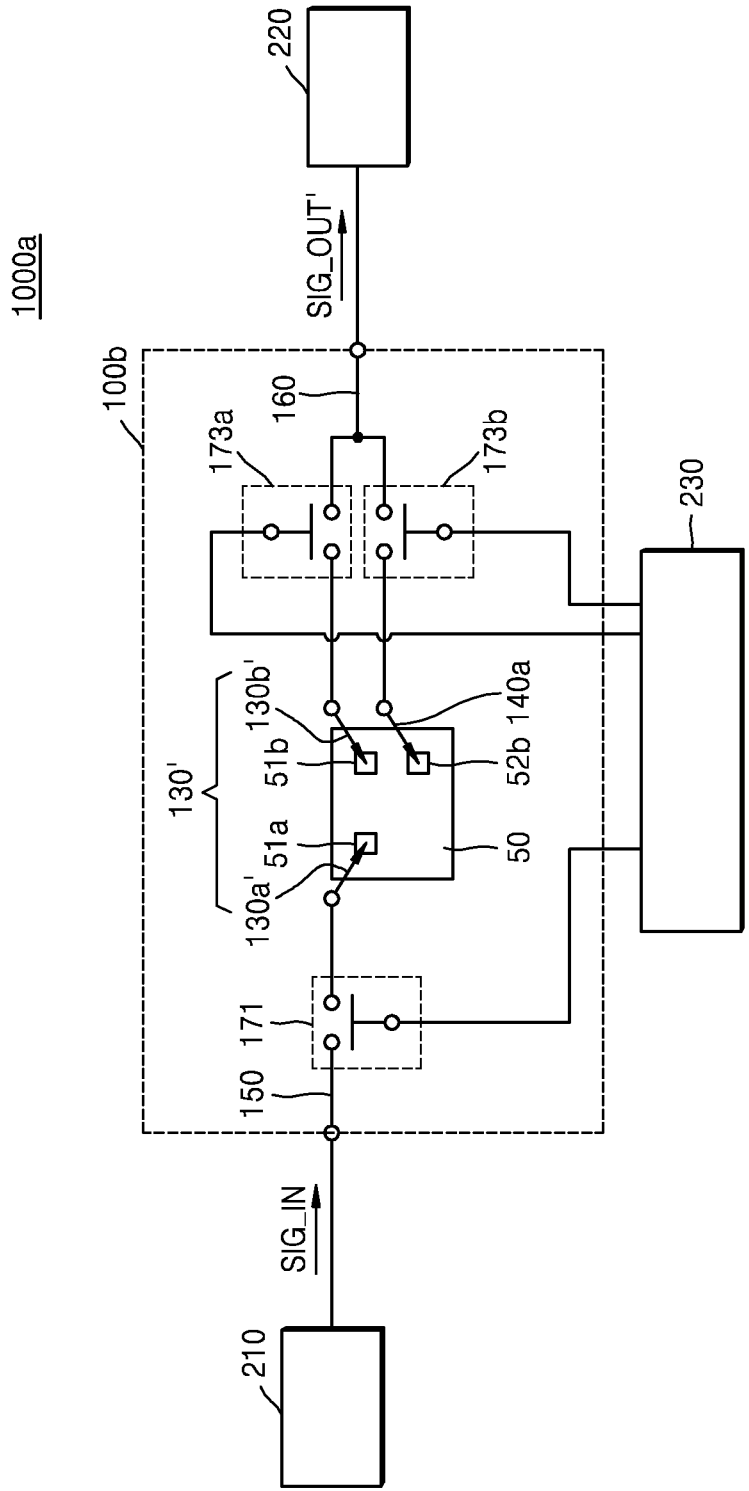

FIGS. 4A and 4B are schematic views illustrating a probe card and a test apparatus including the probe card according to an exemplary embodiment of the inventive concept. In FIG. 4A, a probe card 100*b* corresponds to the probe card 100 in FIG. 1A, and in FIG. 4B, the probe card 100*b* corresponds to the probe card 100 in FIG. 1B.

Referring to FIG. 4A, a test apparatus 1000*a* may include the probe card 100*b*, an input signal applying unit 210, an output signal receiving unit 220, and a switch controller 230.

The input signal applying unit 210 may apply an input signal SIG_IN to an input stage 150. The input signal SIG_IN may include a pulse signal and/or a direct current (DC) signal, but is not limited thereto.

The output signal receiving unit 220 may receive an output signal SIG_OUT provided from an output stage 160. The output signal SIG_OUT may be a pulse signal and/or a DC signal, but is not limited thereto.

The switch controller 230 may generate an operation signal to apply to an input stage switch 171 and an output stage switch (e.g., a first output stage switch 173*a* and a second output stage switch 173*b*).

The switch controller 230 may be connected to the input stage switch 171 and the first and second output stage switches 173*a* and 173*b* through transmitting lines.

The probe card 100*b* may include the input stage 150, the output stage 160, the first probe pin 130 including an input probe pin 130*a* and an output probe pin 130*b*, a second probe pin 140*a*, the input stage switch 171, and the output stage switch including the first and second output stage switches 173*a* and 173*b*.

The input stage 150 may receive the input signal SIG_IN supplied from the input signal applying unit 210. The input stage 150 may include one input stage as shown in FIG. 4A. According to exemplary embodiments of the inventive concept, the input stage 150 may include a plurality of input stages. The input stage 150 may be provided on the substrate 110 in FIG. 1A. As described above, the input signal SIG_IN input to the input stage 150 may be, e.g., a pulse input signal and/or a DC input signal, but is not limited thereto.

The output stage 160 may transmit the output signal SIG_OUT to the output signal receiving unit 220. The output stage 160 may include one output stage as shown in FIG. 4A. According to exemplary embodiments of the inventive concept, the output stage 160 may include a plurality of output stages. The output stage 160 may be provided on the substrate 110 in FIG. 1A. As described above, the output signal SIG_OUT output from the output stage 160 may be, for example, a pulse output signal and/or a DC output signal, but is not limited thereto.

One end of the input probe pin 130*a* of the first probe pin 130 may be electrically connected to the input stage switch 171, and the other end thereof may be electrically connected to an input pad 51*a* of the wafer 50. The input probe pin 130*a* may receive the input signal SIG_IN from the input stage 150 and may transmit the received input signal SIG_IN to the input pad 51*a* of the wafer 50

One end of the output probe pin 130*b* of the first probe pin 130 may be electrically connected to the first output stage switch 173*a*, and the other end thereof may be electrically connected to a first output pad 51*b* of the wafer 50. The output probe pin 130*b* may receive the output signal SIG_OUT from the first output pad 51*b* and may transmit the received output signal SIG_OUT to the output stage 160.

One end of the second probe pin 140*a* may be electrically connected to the second output stage switch 173*b*, and the other end thereof may be electrically connected to a second output pad 52*b* of the wafer 50. The second probe pin 140*a* may receive the output signal SIG_OUT from the second output pad 52*b* and may transmit the received output signal SIG_OUT to the output stage 160.

The input stage switch 171 may be positioned between the input stage 150 and the input probe pin 130*a*. The input stage switch 171 may receive an operation signal from the switch controller 230 to perform a turn-on or turn-off operation, such that the input stage 150 and the input probe pin 130*a* may be electrically connected to or separated from each other. The input stage switch 171 may be positioned in front of (e.g., adjacent to) the input probe pin 130*a* to open and close a path through which the input signal SIG_IN flows.

The first and second output stage switches 173*a* and 173*b* may be positioned between the output stage 160 and the output probe pin 130*b*. The first output stage switch 173*a* may be positioned between the output probe pin 130*b* of the first probe pin 130 and the output stage 160, and the second output stage switch 173*b* may be positioned between the second probe pin 140*a* and the output stage 160. The first output stage switch 173*a* and second output stage switch 173*b* may receive an operation signal from the switch controller 230 to perform a turn-on or turn-off operation, such that the output stage 160 and the output probe pin 130*b* may be electrically connected to or separated from each other, and the output stage 160 and the second probe pin 140*a* may be electrically connected to or separated from each other. The first output stage switch 173*a* and second output stage switch 173*b* may be positioned behind (e.g., adjacent to) the output probe pin 130*b* and the second probe pin 140*a*, respectively, to open and close paths through which the output signal SIG_OUT flows.

The switch controller 230 may simultaneously apply the operation signal to the input stage switch 171 and one of the first and second output stage switches 173*a* and 173*b*. For example, to test an electrical characteristic of the semiconductor device, the input stage switch 171 and the first output stage switch 173*a* may be simultaneously turned on, and the second output stage switch 173*b* may be turned off. Additionally, to detect an over-abrasion status of the first probe pin 130, the input stage switch 171 and the second output stage switch 173*b* may be simultaneously turned on, and the first output stage switch 173*a* may be turned off.

Referring to FIGS. 1A and 4A, when the first probe pin 130 is in a normal state, since the first probe pin 130 has a greater height than the second probe pin 140 or 140*a*, the input probe pin 130*a* and the output probe pin 130*b* may contact the input pad 51*a* and the first output pad 51*b*, respectively, of the wafer 50, and the second probe pin 140*a* may not contact the second output pad 52*b* of the wafer 50.

While the test process proceeds, the input stage switch 171 and the first output stage switch 173*a* may be simultaneously turned on, and thus, the input signal SIG_IN may be input to the input pad 51*a* of the wafer 50 through the input probe pin 130*a*. Accordingly, since the output probe pin 130*b* contacts the first output pad 51*b* of the wafer 50, the output signal SIG_OUT for testing the electrical characteristic of the semiconductor device may be supplied to the output signal receiving unit 220.

Additionally, even though the input stage switch 171 and the second output stage switch 173*b* may be simultaneously turned on, a path electrically connecting the second output pad 52*b* and the output stage 160 may be opened because the second probe pin 140*a* does not contact the second output pad 52b. Thus, the second probe pin 140a may provide an open signal as the output signal SIG_OUT to the output signal receiving unit 220.

Referring to FIGS. 1B and 4B, when the first probe pin 130' excessively wears out, since the first probe pin 130' and the second probe pin 140 or 140a have substantially the same height, an input probe pin 130a' and an output probe pin 130b' of the first probe pin 130' and the second probe pin 140a may contact the input pad 51a, the first output pad 51b, and the second output pad 52b, respectively, of the wafer 50.

While the test process proceeds, the input signal SIG_IN may be input to the input pad 51a of the wafer 50 through the input probe pin 130a', and the output probe pin 130b' may contact the first output pad 51b of the wafer 50 to provide the output signal SIG_OUT' for testing the electrical characteristic of the semiconductor device to the output signal receiving unit 220. However, since the first probe pin 130' has excessively worn out as described above, the input probe pin 130a' may not properly contact the input pad 51a, or the output probe pin 130b' may not properly contact the first output pad 51b.

Since the second probe pin 140a contacts the second output pad 52b, the path electrically connecting the output stage 160 and the second output pad 52b may be short-circuited. Thus, the second probe pin 140a may provide a short-circuit signal as the output signal SIG_OUT' to the output signal receiving unit 220.

According to exemplary embodiments of the inventive concept, the test apparatus 1000a may inspect whether or not the probe card 100b is defective while testing the electrical characteristics of the semiconductor devices included in the wafer 50.

According to exemplary embodiments of the inventive concept, to test an electrical characteristic of the DUT, the test apparatus 1000a may perform a DC test or an alternating current (AC) test. For example, the test apparatus 1000a may apply a predetermined voltage to the input pad 51a of the wafer 50 and may measure a DC characteristic of an open/short-circuit, an input current, an output voltage, or a power supply current, to perform the DC test for determining whether or not the DUT is defective. Additionally, the test apparatus 1000a may apply a pulse signal to the input pad 51a of the wafer 50 and may measure an operation characteristic of an input/output delay time or a start/end time of the output signal (e.g., SIG_OUT), to perform the AC test for determining whether or not the DUT is defective.

According to exemplary embodiments of the inventive concept, the test apparatus 1000a may perform the DC test to inspect whether or not the probe card 100b is defective. For example, a predetermined voltage may be applied to the input pad 51a of the wafer 50 and the output signal SIG_OUT or SIG_OUT' transmitted through the second probe pin 140a may be detected to determine whether or not the probe card 100b is defective.

Figure 5A:
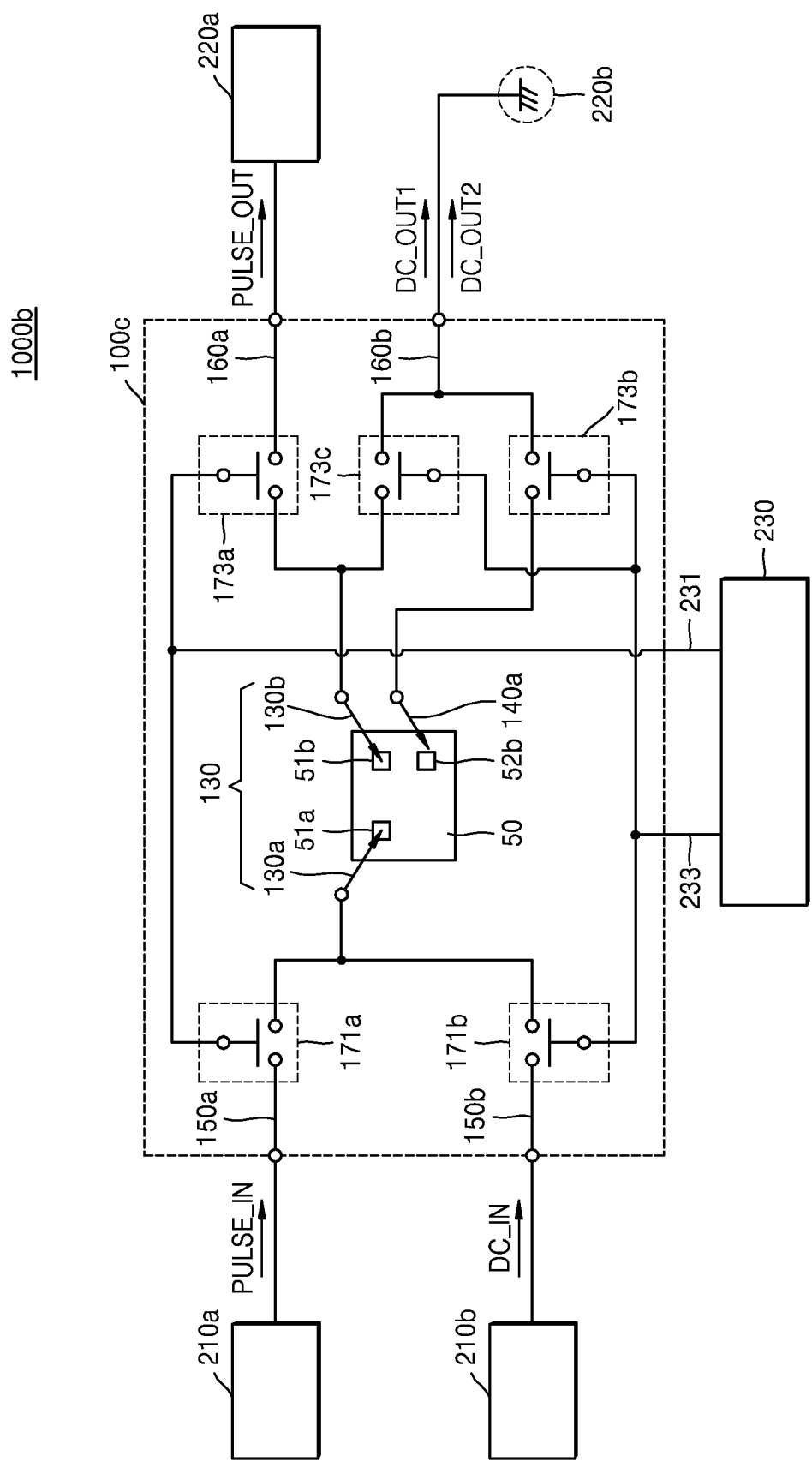
FIGS. 5A and 5B are schematic views illustrating a probe card and a test apparatus including the probe card according to an exemplary embodiment of the inventive concept.
Figure 5B:
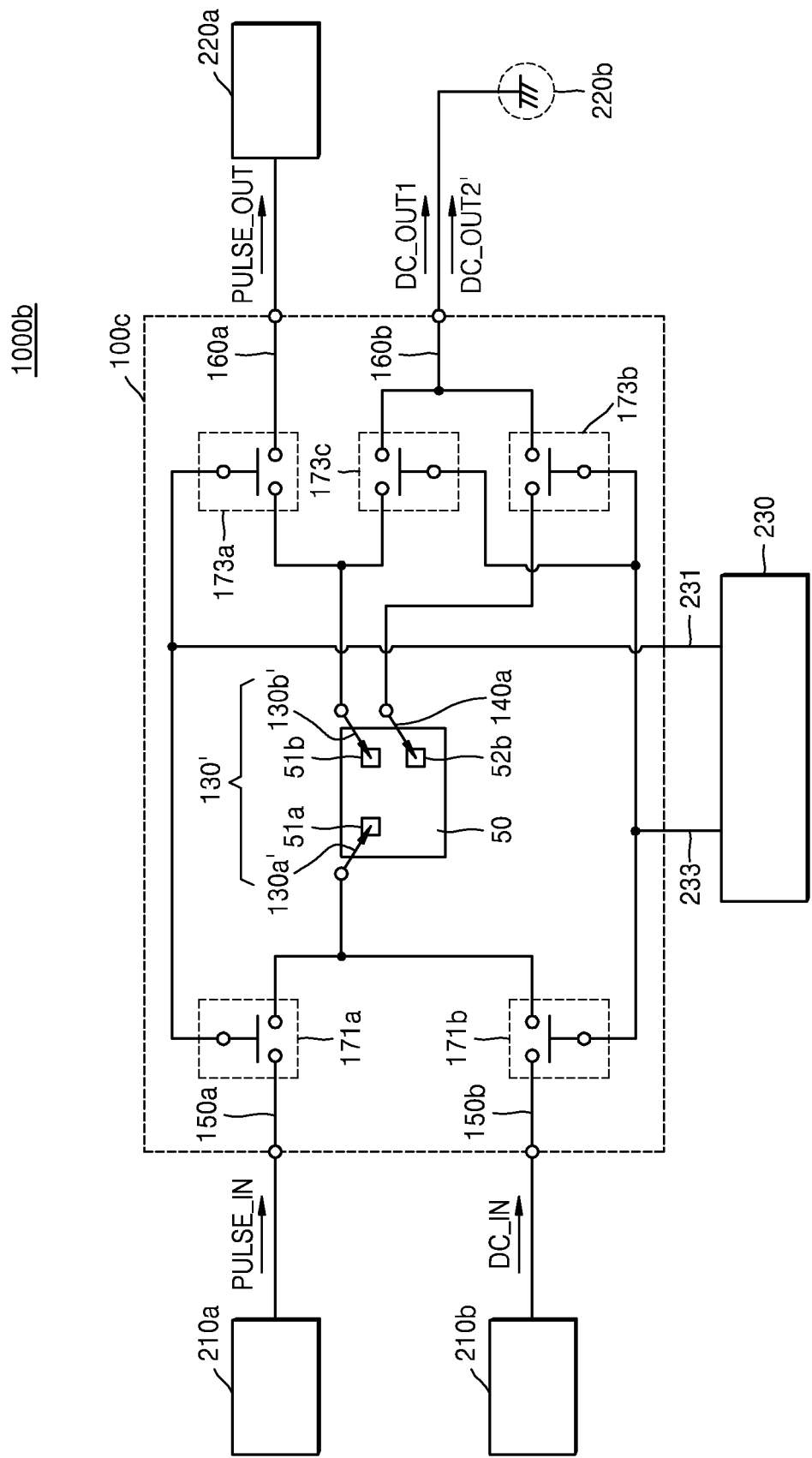

FIGS. 5A and 5B are schematic views illustrating a probe card and a test apparatus including the probe card according to an exemplary embodiment of the inventive concept. In FIG. 5A, a probe card 100c corresponds to the probe card 100 in FIG. 1A, and in FIG. 5B, the probe card 100c corresponds to the probe card 100 in FIG. 1B. In FIGS. 5A and 5B, the same reference numerals are used to denote the same elements as in FIGS. 4A and 4B, and thus repeat descriptions thereof are omitted.

Referring to FIG. 5A, a test apparatus 1000b may include the probe card 100c, a first input signal applying unit 210a, a second input signal applying unit 210b, a first output signal receiving unit 220a, a second output signal receiving unit 220b, and the switch controller 230

The first input signal applying unit 210a may apply a pulse input signal PULSE_IN to a first input stage 150a. The second input signal applying unit 210b may apply a DC input signal DC_IN to a second input stage 150b.

The first output signal receiving unit 220a may receive a pulse output signal PULSE_OUT provided from a first output stage 160a. The second output signal receiving unit 220b may receive a first DC output signal DC_OUT1 and a second DC output signal DC_OUT2 provided from a second output stage 160b. According to exemplary embodiments of the inventive concept, the second output signal receiving unit 220b may include a grounding member.

The switch controller 230 may generate an operation signal to apply the operation signal to a first input stage switch 171a, a second input stage switch 171b, the first output stage switch 173a, the second output stage switch 173b, and a third output stage switch 173c. The switch controller 230 may be connected to the first input stage switch 171a and the first output stage switch 173a via a first transmission line 231. Additionally, the switch controller 230 may be connected to the second input stage switch 171b, the second output stage switch 173b, and the third output stage switch 173c via a second transmission line 233.

The probe card 100c may include the first input stage 150a, the second input stage 150b, the first output stage 160a, the second output stage 160b, the first probe pin 130 including the input probe pin 130a and the output probe pin 130b, the second probe pin 140a, an input stage switch including the first input stage switch 171a and the second input stage switch 171b, and an output stage switch including the first output stage switch 173a, the second output stage switch 173b, and the third output stage switch 173c.

The first input stage 150a may receive the pulse input signal PULSE_IN provided from the first input signal applying unit 210a. The first input stage 150a includes one input stage as shown in FIG. 5A, but may instead include a plurality of input stages.

The second input stage 150b may receive the DC input signal DC_IN provided from the second input signal applying unit 210b. The second input stage 150b includes one input stage as shown in FIG. 5A, but may instead include a plurality of input stages.

The first output stage 160a may transmit the pulse output signal PULSE_OUT to the first output signal receiving unit 220a. The first output stage 160a includes one output stage as shown in FIG. 5A, but may instead include a plurality of output stages.

The second output stage 160b may transmit the first DC output signal DC_OUT1 and the second output signal DC_OUT2 to the second output signal receiving unit 220b. The second output stage 160b includes one output stage as shown in FIG. 5A, but may instead include a plurality of output stages.

One end of the input probe pin 130a may be electrically connected to the input pad 51a of the wafer 50, and the other end thereof may be electrically connected to the first input stage switch 171a and the second input stage switch 171b. The input probe pin 130a may receive the pulse input signal PULSE_IN from the first input stage 150a and may transmit the received pulse input signal PULSE_IN to the input pad 51a. The input probe pin 130a may also receive the DC input signal DC_IN from the second input stage 150b and may transmit the received DC input signal DC_IN to the input pad 51a.

One end of the output probe pin 130b may be electrically connected to the first output pad 51b of the wafer 50, and the other end thereof may be electrically connected to the first output stage switch 173a and the third output stage switch 173c. The output probe pin 130b may receive the pulse output signal PULSE_OUT and the first DC output signal DC_OUT1 from the first output pad 51b, and may transmit the received pulse output signal PULSE_OUT and the received first DC output signal DC_OUT1 to the first output stage 160a and the second output stage 160b, respectively. Here, the pulse output signal PULSE_OUT may be a signal in response to the pulse input signal PULSE_IN input to the input pad 51a, and the first DC output signal DC_OUT1 may be a signal in response to the DC input signal DC_IN input to the input pad 51a.

One end of the second probe pin 140a may be electrically connected to the second output pad 52b of the wafer 50, and the other end thereof may be electrically connected to the second output stage switch 173b. The second probe pin 140a may receive the second DC output signal DC_OUT2 from the second output pad 52b and may transmit the received second DC output signal DC_OUT 2 to the second output stage 160b. Here, the second DC output signal DC_OUT2 may be a signal in response to the DC input signal DC_IN input to the input pad 51a.

The first input stage switch 171a may be positioned between the first input stage 150a and the input probe pin 130a, and the second input stage switch 171b may be positioned between the second input stage 150b and the input probe pin 130a. The first input stage switch 171a may receive an operation signal applied from the switch controller 230 and may perform a turn-on or turn-off operation to electrically connect or separate the first input stage 150a and the input probe pin 130a. The second input stage switch 171b may receive an operation signal applied from the switch controller 230 and may perform a turn-on or turn-off operation to electrically connect or separate the second input stage 150b and the input probe pin 130a.

The first output stage switch 173a may be positioned between the first output stage 160a and the output probe pin 130b, the third output stage switch 173c may be positioned between the second output stage 160b and the output probe pin 130b, and the second output stage switch 173b may be positioned between the second output stage 160b and the second probe pin 140a. The first output stage switch 173a may receive an operation signal from the switch controller 230 and may perform a turn-on or turn-off operation to electrically connect or separate the first output stage 160a and the output probe pin 130b. The third output stage switch 173c may receive an operation signal from the switch controller 230 and may perform a turn-on or turn-off operation to electrically connect or separate the second output stage 160b and the output probe pin 130b. The second output stage switch 173b may receive an operation signal from the switch controller 230 and may perform a turn-on or turn-off operation to electrically connect or separate the second output stage 160b and the second probe pin 140a.

The switch controller 230 may simultaneously turn on the first input stage switch 171a and the first output stage switch 173a to perform an AC test for testing the electrical characteristic of the semiconductor device. Thus, the pulse input signal PULSE_IN generated from the first input signal applying unit 210a may be transmitted to the input pad 51a, and the pulse output signal PULSE_OUT output from the first output pad 51b in response to the pulse input signal PULSE_IN may be transmitted to the first output signal receiving unit 220a.

The switch controller 230 may simultaneously turn on the second input stage switch 171b and the third output stage switch 173c to perform a DC test for testing the electrical characteristic of the semiconductor device. Thus, the DC input signal DC_IN generated from the second input signal applying unit 210b may be transmitted to the input pad 51a, and the first DC output signal DC_OUT1 output from the first output pad 51b in response to the DC input signal DC_IN may be transmitted to the second output signal receiving unit 220b.

The switch controller 230 may simultaneously turn on the second input stage switch 171b and the second output stage switch 173b to perform a DC test for inspecting whether or not the probe card 100c is defective. Thus, the DC input signal DC_IN generated from the second input signal applying unit 210b may be transmitted to the input pad 51a, and the second DC output signal DC_OUT2 output from the second output pad 52b in response to the DC input signal DC_IN may be transmitted to the second output signal receiving unit 220b.

Referring to FIGS. 1A and 5A, when the first probe pin 130 is in a normal state, since the first probe pin 130 has a greater height than the second probe pin 140 or 140a, the input probe pin 130a and the output probe pin 130b may contact the input pad 51a and the first output pad 51b, respectively, and the second probe pin 140a may not contact the second output pad 52b. For example, a path electrically connecting the second output pad 52b and the second output stage 160b may be opened. Accordingly, while the test process proceeds, the second DC output signal DC_OUT2 transmitted to the second output signal receiving unit 220b through the second probe pin 140a may be an open signal.

Referring to FIGS. 1B and 5B, when the first probe pin 130' excessively wears out, since the first probe pin 130' and the second probe pin 140 or 140a have substantially the same height, the input probe pin 130a', the output probe pin 130b', and the second probe pin 140a may contact the input pad 51a, the first output pad 51b, and the second output pad 52b, respectively. For example, a path electrically connecting the second output pad 52b and the second output stage 160b may be short-circuited. Accordingly, while the test process proceeds, a second DC output signal DC_OUT2' transmitted to the second output signal receiving unit 220b through the second probe pin 140a may be a short-circuit signal.

Figure 6A:
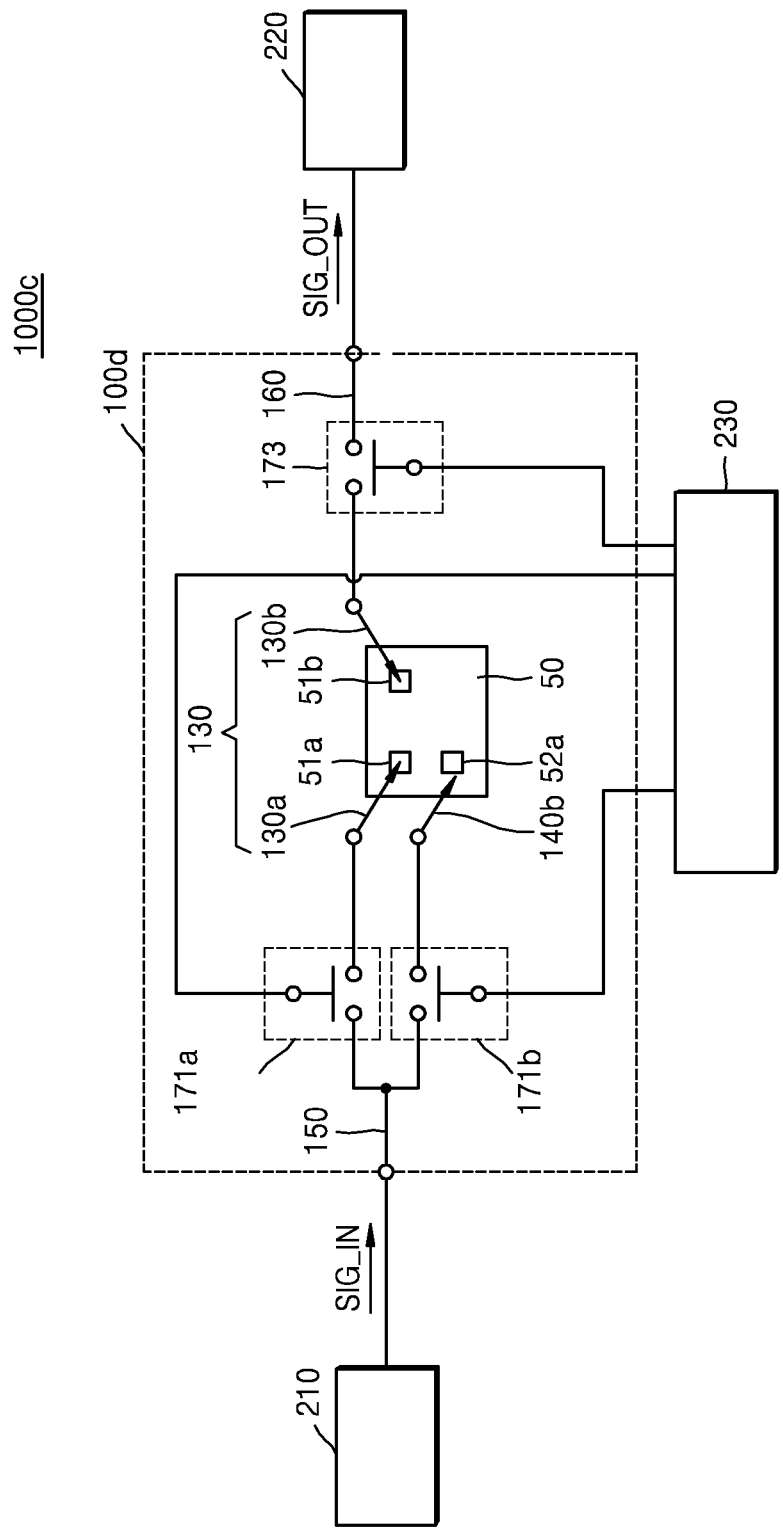
FIGS. 6A and 6B are schematic views illustrating a probe card and a test apparatus including the probe card according to an exemplary embodiment of the inventive concept.
Figure 6B:
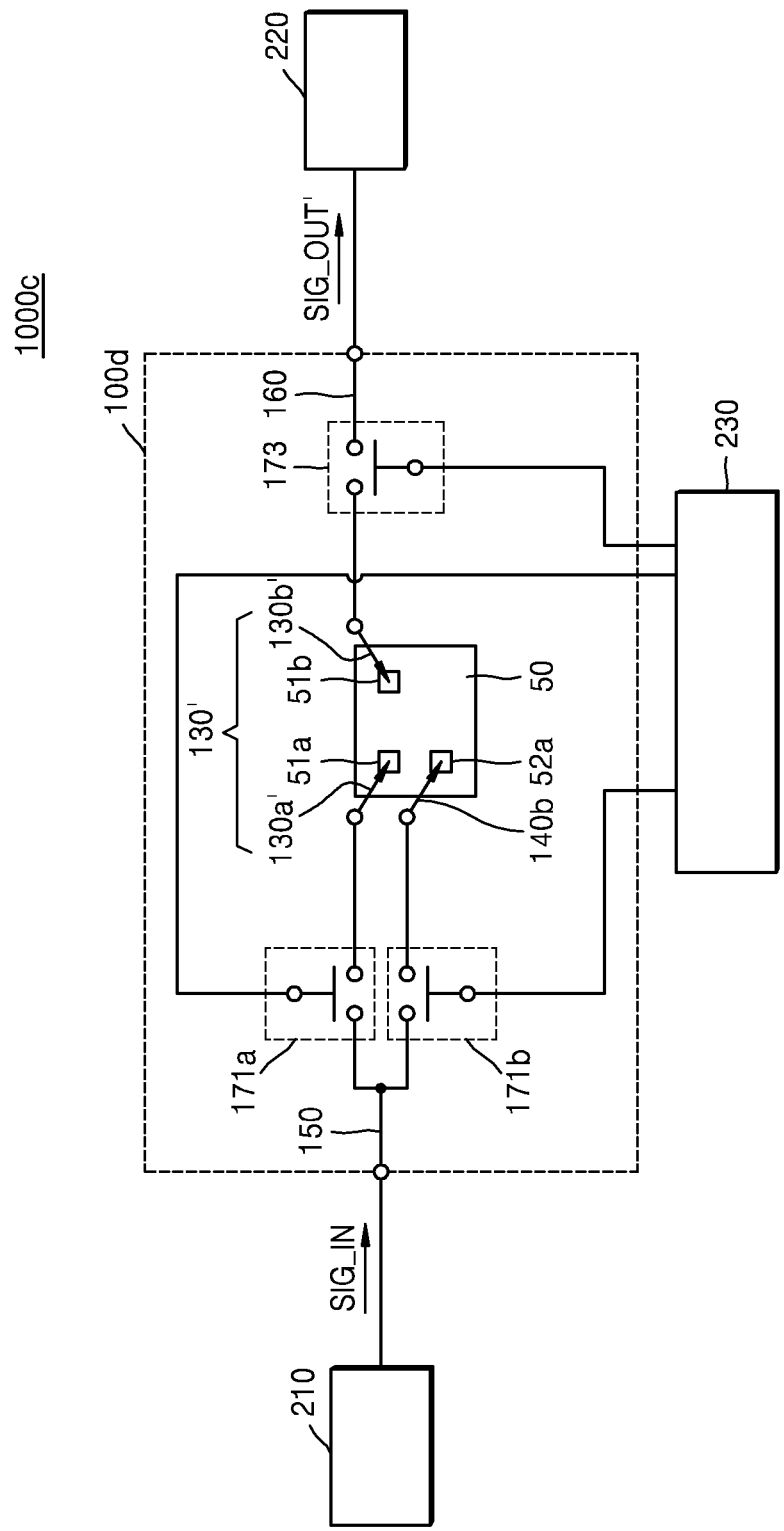

FIGS. 6A and 6B are schematic views illustrating a probe card and a test apparatus including the probe card according to an exemplary embodiment of the inventive concept. In FIG. 6A, a probe card 100d corresponds to the probe card 100 in FIG. 1A, and in FIG. 6B, the probe card 100d corresponds to the probe card 100 in FIG. 1B. In FIGS. 6A and 6B, the same reference numerals are used to denote the same elements as in FIGS. 4A to 5B, and thus repeat descriptions thereof are omitted.

Referring to FIG. 6A, the probe card 100d may include the input stage 150, the output stage 160, the first probe pin 130 including the input probe pin 130a and the output probe pin 130b, a second probe pin 140b, an input stage switch including the first input stage switch 171a and the second input stage switch 171b, and an output stage switch 173. A test apparatus 1000c may include the probe card 100d, the input signal applying unit 210, the output signal receiving unit 220, and the switch controller 230.

One end of the second probe pin 140b may be electrically connected to the second input stage switch 171b, and the other end thereof may be electrically connected to a second input pad 52a of the wafer 50 (the input pad 51a described above may also be referred to as a first input pad 51*a*). The second probe pin 140*b* may transmit the input signal SIG_IN applied from the input signal applying unit 210 to the second input pad 52*a*.

The second input stage switch 171*b* may be positioned between the input stage 150 and the second probe pin 140*b* and may perform a turn-on or turn-off operation to electrically connect or separate the input stage 150 and the second probe pin 140*b*.

One end of the output probe pin 130*b* may be electrically connected to the output stage switch 173, and the other end thereof may be electrically connected to an output pad 51*b* of the wafer 50 (the first output pad 51*b* described above may also be referred to as the output pad 51*b*). The output probe pin 130*b* may transmit the output signal SIG_OUT output from the output pad 51*b*, in response to the input signal SIG_IN input to the first input pad 51*a* and the second input pad 52*a*, to the output stage 160.

The switch controller 230 may simultaneously apply an operation signal to the output stage switch 173 and one of the first and second input stage switches 171*a* and 171*b*. For example, to test the electrical characteristic of the semiconductor device, the switch controller 230 may simultaneously turn on the first input stage switch 171*a* and the output stage switch 173 and may turn off the second input stage switch 171*b*. Additionally, to detect an over-abrasion status of the first probe pin 130, the switch controller 230 may simultaneously turn on the second input stage switch 171*b* and the output stage switch 173 and may turn off the first input stage switch 171*a*.

Referring to FIGS. 1A and 6A, when the first probe pin 130 is in a normal state, since the first probe pin 130*a* the greater height than the second probe pin 140 or 140*b*, the input probe pin 130*a* and the output probe pin 130*b* may contact the first input pad 51*a* and the output pad 51*b*, respectively, and the second probe pin 140*b* may not contact the second input pad 52*a*.

Accordingly, while the test process proceeds, since the second probe pin 140*b* does not contact the second input pad 52*a*, a path electrically connecting the input stage 150 and the second input pad 52*a* may be opened. Thus, the output signal SIG_OUT, output from the output pad 51*b* in response to the input signal SIG_IN transmitted to the second probe pin 140*b*, may be an open signal, and the output stage 160 may provide the open signal to the output signal receiving unit 220.

Referring to FIGS. 1B and 6B, when the first probe pin 130' excessively wears out, since the first probe pin 130' and the second probe pin 140 or 140*b* have substantially the same height, the input probe pin 130*a'*, the output probe pin 130*b'*, and the second probe pin 140*b* may contact the first input pad 51*a*, the output pad 51*b*, and the second input pad 52*a*, respectively.

Accordingly, while the test process proceeds, since the second probe pin 140*b* contacts the second input pad 52*a*, a path electrically connecting the input stage 150 and the second input pad 52*a* may be short-circuited. Thus, the output signal SIG_OUT', output from the output pad 51*b* in response to the input signal SIG_IN input to the second input pad 52*a*, may be a short-circuit signal, and the output stage 160 may provide the short-circuit signal to the output signal receiving unit 220.

Figure 7A:
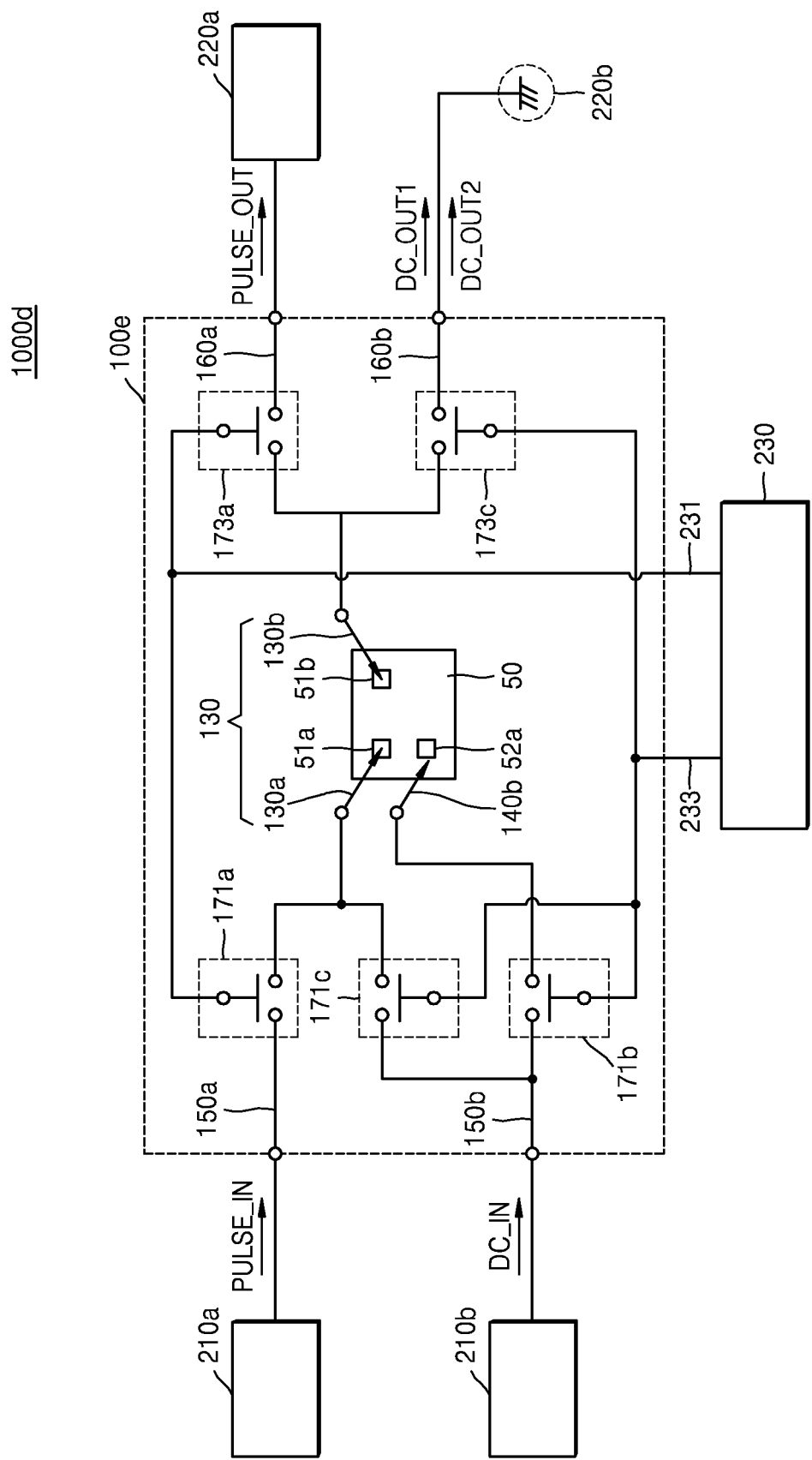
FIGS. 7A and 7B are schematic views illustrating a probe card and a test apparatus including the probe card according to an exemplary embodiment of the inventive concept.
Figure 7B:
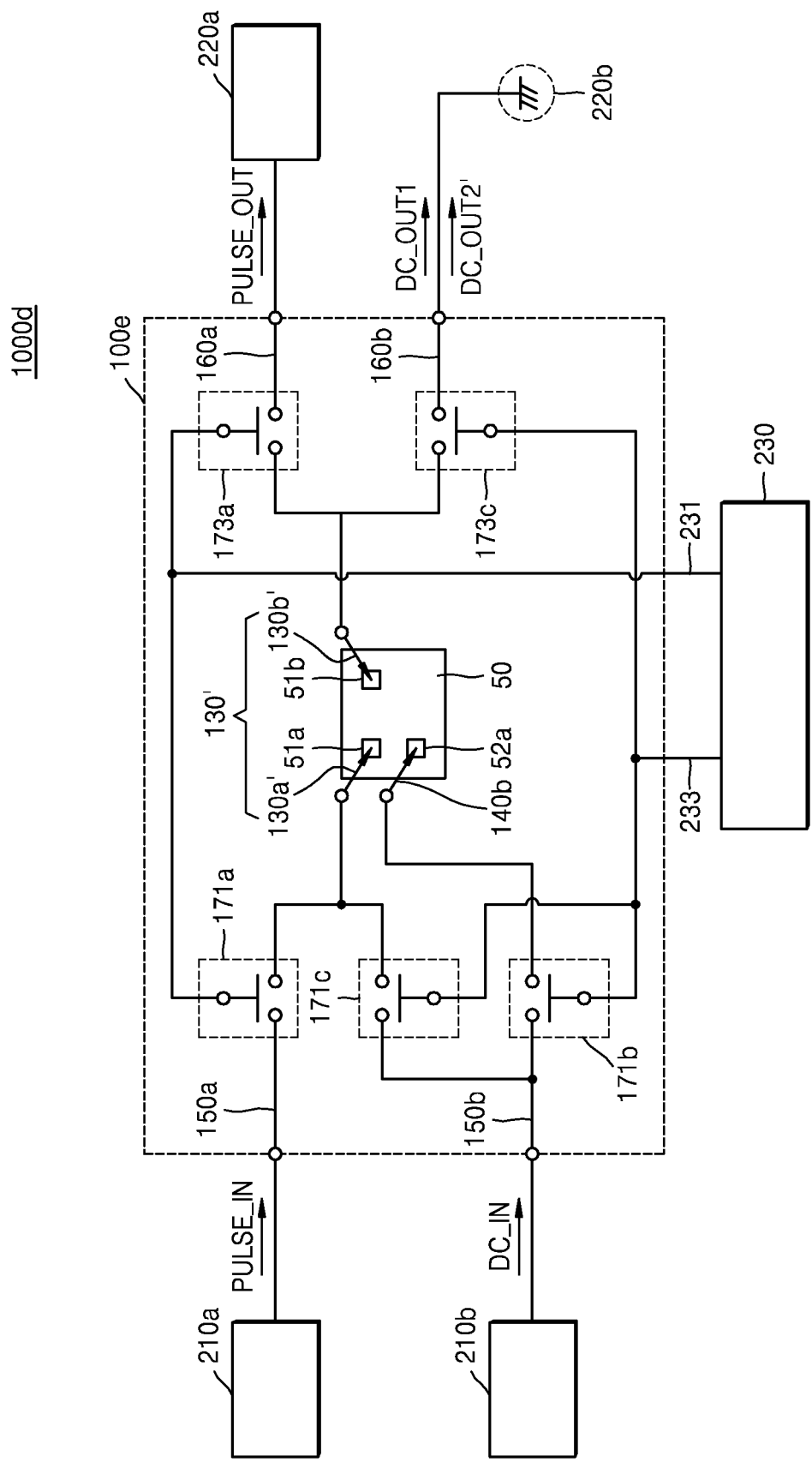

FIGS. 7A and 7B are schematic views illustrating a probe card and a test apparatus including the probe card according to an exemplary embodiment of the inventive concept. In FIG. 7A, a probe card 100*e* corresponds to the probe card 100 in FIG. 1A, and in FIG. 6B, the probe card 100*e* corresponds to the probe card 100 in FIG. 1B. In FIGS. 7A and 7B, the same reference numerals are used to denote the same elements as in FIGS. 4A to 6B, and thus repeat descriptions thereof are omitted.

Referring to FIG. 7A, the probe card 100*e* may include the first input stage 150*a*, the second input stage 150*b*, the first output stage 160*a*, the second output stage 160*b*, the first probe pin 130 including the input probe pin 130*a* and the output probe pin 130*b*, the second probe pin 140*b*, an input stage switch including the first input stage switch 171*a*, the second input stage switch 171*b*, and a third input stage switch 171*c*, and an output stage switch including the first output stage switch 173*a* and the third output stage switch 173*c*.

One end of the input probe pin 130*a* may be electrically connected to the first input pad 51*a* of the wafer 50, and the other end thereof may be electrically connected to the first input stage switch 171*a* and the third input stage switch 171*c*. The input probe pin 130*a* may receive the pulse input signal PULSE_IN from the first input stage 150*a* and may transmit the received pulse input signal PULSE_IN to the first input pad 51*a*. The input probe pin 130*a* may also receive the DC input signal DC_IN from the second input stage 150*b* and may transmit the received DC input signal DC_IN to the first input pad 51*a*.

One end of the second probe pin 140*b* may be electrically connected to the second input pad 52*a* of the wafer 50, and the other end thereof may be electrically connected to the second input stage switch 171*b*. The second probe pin 140*b* may receive the DC input signal DC_IN from the second input stage 150*b* and may transmit the received the DC input signal DC_IN to the second input pad 52*a*.

One end of the output probe pin 130*b* may be electrically connected to the output pad 51*b* of the wafer 50, and the other end thereof may be electrically connected to the first output stage switch 173*a* and the third output stage switch 173*c*. The output probe pin 130*b* may receive the pulse output signal PULSE_OUT, the first DC output signal DC_OUT1, and the second DC output signal DC_OUT2 from the output pad 51*b*. The output probe pin 130*b* may transmit the received the pulse output signal PULSE_OUT to the first output stage 160*a* and may transmit the received first and second DC output signals DC_OUT1 and DC_OUT2 to the second output stage 160*b*. Here, the pulse output signal PULSE_OUT may be a signal in response to the pulse input signal PULSE_IN input to the first input pad 51*a*, the first DC output signal DC_OUT1 may be a signal in response to the DC input signal DC_IN input to the first input pad 51*a*, and the second DC output signal DC_OUT2 may be a signal in response to the DC input signal DC_IN input to the second input pad 52*a*.

The first input stage switch 171*a* may be positioned between the first input stage 150*a* and the input probe pin 130*a*, the second input stage switch 171*b* may be positioned between the second input stage 150*b* and the second probe pin 140*b*, and the third input stage switch 171*c* may be positioned between the second input stage 150*b* and the input probe pin 130*a*.

The first input stage switch 171*a* may receive an operation signal applied from the switch controller 230 and may perform a turn-on or turn-off operation to electrically connect or separate the first input stage 150*a* and the input probe pin 130*a*. The second input stage switch 171*b* may receive an operation signal applied from the switch controller 230 and may perform a turn-on or turn-off operation to electrically connect or separate the second input stage 150*b* and the second probe pin 140*b*. The third input stage switch 171*c* may receive an operation signal applied from the switch controller 230 and may perform a turn-on or turn-off operation to electrically connect or separate the second input stage 150b and the input probe pin 130a.

The first output stage switch 173a may be positioned between the first output stage 160a and the output probe pin 130b, and the third output stage switch 173c may be positioned between the second output stage 160b and the output probe pin 130b. The first output stage switch 173a may receive an operation signal applied from the switch controller 230 and may perform a turn-on or turn-off operation to electrically connect or separate the first output stage 160a and the output probe pin 130b. The third output stage switch 173c may receive an operation signal applied from the switch controller 230 and may perform a turn-on or turn-off operation to electrically connect or separate the second output stage 160b and the output probe pin 130b.

A test apparatus 1000d may include the probe card 100e, the first input signal applying unit 210a, the second input signal applying unit 210b, the first output signal receiving unit 220a, the second output signal receiving unit 220b, and the switch controller 230.

The switch controller 230 may generate operation signals and may apply the operation signals to the first through third input stage switches 171a, 171b, and 171c and the first and third output stage switches 173a and 173c. The switch controller 230 may be connected to the first input stage switch 171a and the first output stage switch 173a through the first transmission line 231. The switch controller 230 may be connected to the second input stage switch 171b, the third input stage switch 171c, and the third output stage switch 173c through the second transmission line 233.

The switch controller 230 may simultaneously turn on the first input stage switch 171a and the first output stage switch 173a to perform an AC test for testing the electrical characteristic of the semiconductor device. Thus, the pulse input signal PULSE_IN generated from the first input signal applying unit 210a may be transmitted to the first input pad 51a, and the pulse output signal PULSE_OUT, output from the output pad 51b in response to the pulse input signal PULSE_IN, may be transmitted to the first output signal receiving unit 220a.

The switch controller 230 may simultaneously turn on the third input stage switch 171c and the third output stage switch 173c to perform a DC test for testing the electrical characteristic of the semiconductor device. Thus, the DC input signal DC_IN generated from the second input signal applying unit 210b may be transmitted to the first input pad 51a, and the first DC output signal DC_OUT1, output from the output pad 51b in response to the DC input signal, DC_IN, may be transmitted to the second output signal receiving unit 220b.

The switch controller 230 may simultaneously turn on the second input stage switch 171b and the third output stage switch 173c to perform a DC test for inspecting whether or not the probe card 100e is defective. Thus, the DC input signal DC_IN generated from the second input signal applying unit 210b may be transmitted to the second input pad 52a, and the second DC output signal DC_OUT2, output from the output pad 51b in response to the DC input signal DC_IN, may be transmitted to the second output signal receiving unit 220b.

Referring to FIGS. 1A and 7A, when the first probe pin 130 is in a normal state, since the first probe pin 130 has a greater height than the second probe pin 140 or 140b, the input probe pin 130a and the output probe pin 130b may contact the input pad 51a and the output pad 51b, respectively, and the second probe pin 140b may not contact the second input pad 52a. For example, a path electrically connecting the second input stage 150b and the second input pad 52a may be opened. Accordingly, while the test process proceeds, the second DC output signal DC_OUT2 transmitted to the second output signal receiving unit 220b through the second probe pin 140b and the output probe pin 130b may be an open signal.

Referring to FIGS. 1B and 7B, when the first probe pin 130' excessively wears out, since the first probe pin 130' and the second probe pin 140 or 140b have substantially the same height, the input probe pin 130a', the output probe pin 130b', and the second probe pin 140b may contact the first input pad 51a, the output pad 51b, and the second input pad 52a, respectively. For example, a path electrically connecting the second input stage 150b and the second input pad 52a may be short-circuited. Accordingly, while the test process proceeds, the second DC output signal DC_OUT2' transmitted to the second output signal receiving unit 220b through the second probe pin 140b and the output probe pin 130b' may be a short-circuit signal.

Figure 8:
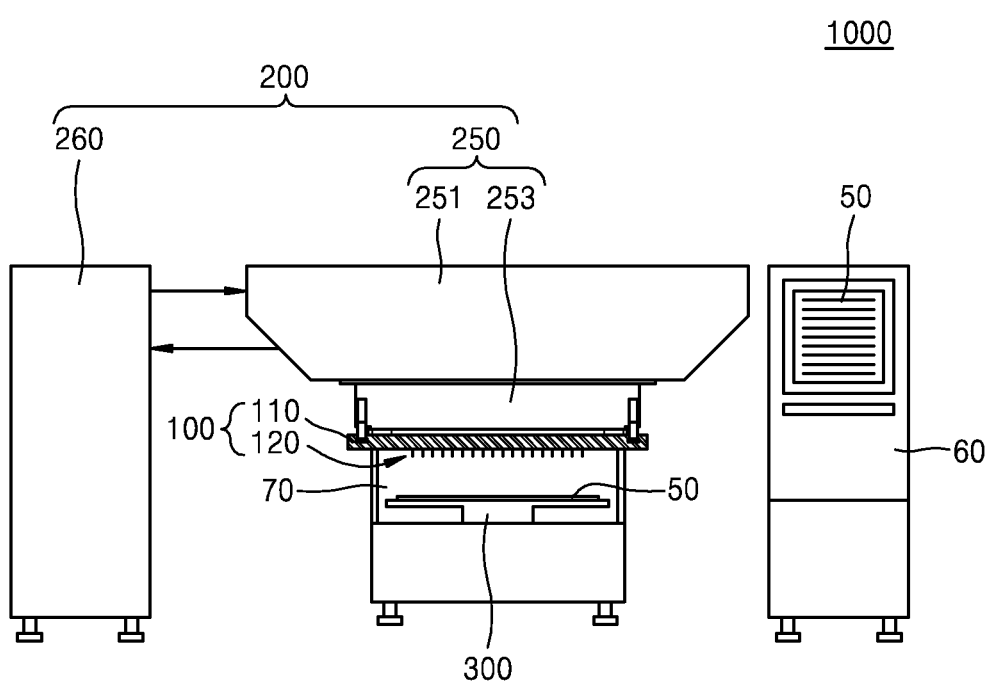
FIG. 8 is a schematic view illustrating a test apparatus according to an exemplary embodiment of the inventive concept.

FIG. 8 is a schematic view illustrating a test apparatus according to an exemplary embodiment of the inventive concept.

Referring to FIG. 8, a test apparatus 1000 may include the probe card 100, a test chamber 70, the tester 200, and a loader chamber 60. The tester 200 may include a test head 250 and a test body 260. The test head 250 and the test body 260 may be connected to enable transmission and reception via wired or wireless communication.

As described above, the probe card 100 may include the substrate 110 and the probe pin 120. Since each of the semiconductor devices formed on the wafer 50 is relatively small, the tester 200 generating an electrical signal may not directly contact each semiconductor device. Thus, the probe card 100 may be used as an intermediate medium between the tester 200 and the wafer 50 including the semiconductor devices.

The substrate 110 may have a circular shape. A plurality of male or female connectors may be formed along a circumferential direction on an upper surface of the substrate 110. The probe card 100 may be coupled with the test head 250 positioned thereon using the male or female connectors.

The probe pin 120 may be attached to a surface of the wafer 50 to physically contact each of the semiconductor devices and transmit the electrical signal, received from the tester 200, to each of the semiconductor devices. For example, the probe pin 120 may contact a pad of each semiconductor device and may transmit the electrical signal, e.g., power and/or other signals received from the tester 200 to the pad of each semiconductor device. According to exemplary embodiments of the inventive concept, the probe pin 120 may be removed from the probe card 100 after completing the test process.

Figure 9:
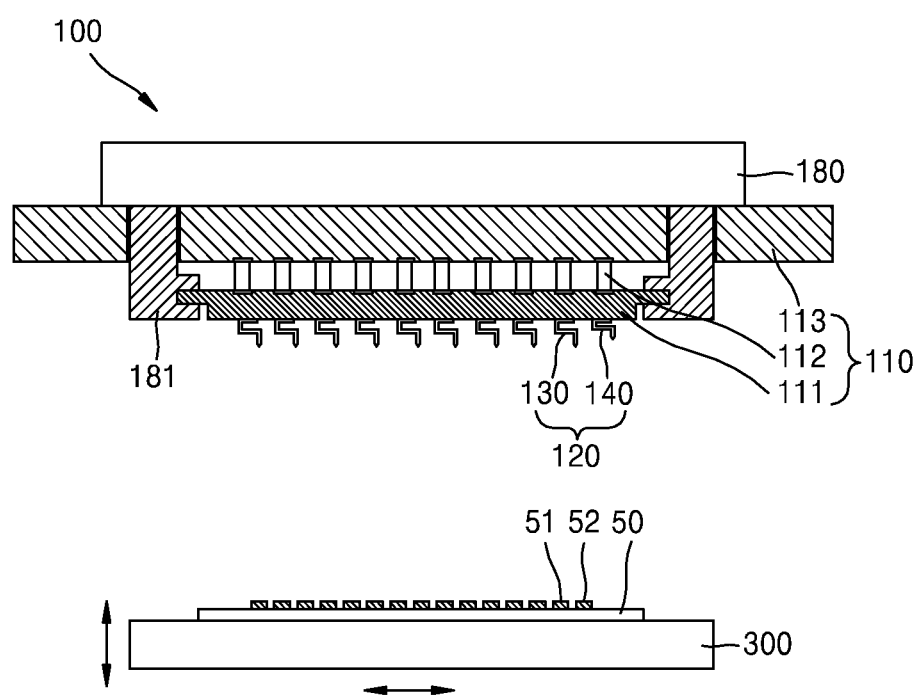
FIG. 9 is a schematic view illustrating the probe card of FIG. 1A according to an exemplary embodiment of the inventive concept.

The test chamber 70 may provide a room or space for testing an electrical characteristic of the semiconductor devices. A stage 300 for supporting the wafer 50 may be disposed in the test chamber 70. The stage 300 may serve to move the wafer 50 up/down and/or left/right as shown in FIG. 9.

For example, when the wafer 50 to be tested in the test process is placed in a proper position, the stage 300 may move the wafer 50 up such that the probe pin 120 of the probe card 100 contacts the pad of each of the semiconductor devices of the wafer 50. When the test process is completed, the stage 300 may move the wafer 50 down.

The probe card 100 may be disposed so that the surface of the probe card 100 on which the probe pin 120 is disposed is facing an opened upper portion of the test chamber 70. The wafer 50 may be placed on the stage 300 to face the probe card 100, in the test chamber 70. When the wafer 50 is placed on the stage 300, the pads of the semiconductor devices may be aligned in an arrangement direction of the probe pin 120 of the probe card 100 using a flat zone or a notch of the wafer 50.

When the pads of the semiconductor devices are aligned with the probe pin 120 of the probe card 100, the stage 300 may linearly move in an up-down direction such that the pads of the semiconductor devices may electrically contact the probe pin 120.

The test head 250 may include a test head board 251 and a base 253. The test head board 251 may constitute a body of the test head 250. The test head board 251 may have a rectangular plate shape in a plan view and a sloped sidewall such that an area of an upper surface of the test head board 251 may be greater than an area of a lower surface thereof. However, the shape of the test head board 251 is not limited thereto. For example, the upper surface and the lower surface of the test head board 251 may have a same rectangular plate shape or a circular plate shape.

The base 253 may be disposed on the lower surface of the test head board 251. The base 253 may have a ring shape where a central portion thereof is hollow. The probe card 100 may be coupled with a lower surface of the base 253. The base 253 may have various structures depending on a shape of the probe card 100.

The test body 260 may generate an electrical signal for testing the semiconductor devices and may transmit the electrical signal to each of the semiconductor devices of the wafer 50 through the test head 250 and the probe card 100. Additionally, the test body 260 may receive an output signal output from each semiconductor device in response to the electrical signal transmitted thereto through the probe card 100 and the test head 250 to determine whether or not the semiconductor devices and/or the probe pin 120 are defective.

The loader chamber 60 may be configured to store the wafer 50 to be tested. The wafer 50 stored in the loader chamber 60 may include a plurality of wafers and may be transferred one by one onto the stage 300 of the test chamber 70 by a moving means.

FIG. 9 is a schematic view illustrating the probe card of FIG. 1A according to an exemplary embodiment of the inventive concept.

Referring to FIG. 9, the probe card 100 may include the substrate 110, the probe pin 120, and a mechanism section 180. The substrate 110 may include a supporting substrate 111, an interposer 112, and a circuit substrate 113.

The circuit substrate 113 may be electrically connected to the tester 200 of FIG. 8 and may include a cable connector for receiving and transmitting an electrical signal from and to the tester 200. The circuit substrate 113 may include various electronic circuits for transmitting the electrical signal. For example, the circuit substrate 113 may include various relay components, such as a DC relay and/or a power relay, for performing a parallel test.

The supporting substrate 111 may face the stage 300 and may be disposed substantially parallel to the circuit substrate 113. The supporting substrate 111 may be fixed by a connection pillar 181 extending from the mechanism section 180. The probe pin 120 may be attached to a surface of the supporting substrate 111 facing the stage 300. For example, a plurality of probe pins 120 may be attached to the surface of the supporting substrate 111. The probe pins 120 may include the first probe pin 130 and the second probe pin 140 which have different heights protruding from the surface of the supporting substrate 111 in a perpendicular direction relative to the surface of the supporting substrate 111. The supporting substrate 111 may include, for example, a multi-layer ceramic substrate or a single-layer ceramic substrate, but is not limited thereto.

The interposer 112 may be disposed between the circuit substrate 113 and the supporting substrate 111 to electrically connect the circuit substrate 113 and the supporting substrate 111.

The mechanism section 180 may be disposed on an upper surface of the circuit substrate 113. The mechanism section 180 may be configured to adjust flatness of the probe card 100 and to evenly distribute a load applied to the probe card 100 during the test process.

While the inventive concept has been shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A test apparatus for testing an electrical characteristic of a device under test (DUT) including a plurality of semiconductor devices, the test apparatus comprising:
    a tester;
    a substrate including a plurality of channels;
    a first probe pin on a surface of the substrate, wherein the first probe pin includes a first tip portion contacting a first pad of the DUT; and
    a second probe pin on the surface of the substrate, wherein the second probe pin includes a second tip portion contacting a second other pad of the DUT,
    wherein the first probe pin protrudes further than the second probe pin protrudes from the surface of the substrate in a first direction that is substantially perpendicular to the surface of the substrate, and
    wherein the plurality of channels are configured to transmit electrical signals from the first and second probe pins,
    wherein tester determines whether the first probe pin has become over-worn based on a signal detected through the second probe pin,
    wherein the tester determines that the first probe pin has become over-worn when the detected signal indicates a short circuit between the second probe pin and the second pad and determines that the first probe pin is not over-worn when the detected signal indicates an open circuit between the second probe pin and the second pad, and
    wherein a height of the first probe pin is greater than a height of the second probe pin.

2. The test apparatus of claim 1, wherein each of the first and second probe pins further includes:
    a supporting portion; and
    a connecting portion connecting the supporting portion and the tip portion of a respective one of the first and second probe pins.

3. The test apparatus of claim 2,, wherein a height of the supporting portion of the first probe pin extending in the first direction from the surface of the substrate is greater than a height of the supporting portion of the second probe pin extending in the first direction from the surface of the substrate.

4. The test apparatus of claim 2, wherein a height of the tip portion of the first probe pin extending in the first direction away from the surface of the substrate is greater than a height of the tip portion of the second probe pin extending in the first direction away from the surface of the substrate.

5. The test apparatus of claim 1, wherein the substrate includes an input stage configured to receive an input signal provided from an outside of the substrate and an output stage configured to transmit an output signal to the outside of the substrate, and
the second probe pin is configured to open or short-circuit a path for electrically connecting the input stage and the output stage.

6. The test apparatus of claim 5, wherein the first probe pin includes an input probe pin positioned between the input stage and an input pad of the DUT and an output probe pin positioned between a first output pad of the DUT and the output stage, and
the second probe pin is positioned between a second output pad of the DUT and the output stage.

7. The test apparatus of claim 5, wherein the first probe pin includes an input probe pin positioned between the input stage and a first input pad of the DUT and an output probe pin positioned between an output pad of the DUT and the output stage, and
the second probe pin is positioned between the input stage and a second input pad of the DUT.

8. The test apparatus of claim 1, wherein the second probe pin includes two or more probe pins having different heights extending in the first direction from the substrate.

9. The test apparatus of claim 1, wherein the first probe pin has a first height extending in the first direction from the substrate,
the second probe pin has a second height extending in the first direction from the substrate, and
the first height is greater than the second height by about 10 µm to about 40 µm.

10. A test apparatus comprising:
a tester configured to provide an input signal;
a stage configured to support a wafer including a plurality of semiconductor devices; and
a probe card configured to transmit the input signal to the wafer, and to transmit an output signal, output from the wafer in response to the input signal, to the tester,
wherein the probe card includes a substrate, a first probe pin, and a second probe pin,
the first probe pin and the second probe pin are provided on a surface of the substrate, the first probe pin capable of contacting a first pad of the wafer and the second probe pin capable of contacting a second other pad of the wafer,
the tester is configured to test electrical characteristics of the plurality of semiconductor devices using the output signal and to inspect an over-abrasion status of the first probe pin,
the tester is configured to determine that the first probe pin is in a normal state when an output signal output through the second probe pin is an open signal, and configured to determine that the first probe pin is defective when the output signal output through the second probe pin is a short-circuit signal, and
the output signal is the short-circuit signal when the second probe pin contacts the second pad of the wafer and the output signal is the open signal when the second probe pin does not contact the second pad of the wafer,
wherein a height of the first probe pin is greater than a height of the second probe pin.

11. The test apparatus of claim 10, wherein a height of the first probe pin extending from the surface of the substrate in first direction substantially perpendicular to the surface of the substrate is greater than a height of the second probe pin extending from the surface of the substrate in the first direction.

12. The test apparatus of claim 10, wherein the first probe pin includes an input probe pin and an output probe pin,
the input probe pin is configured to transmit the input signal to an input pad of the wafer,
the output probe pin is configured to receive the output signal output from a first output pad of the wafer, and
the second probe pin is configured to receive the output signal output from a second output pad of the wafer.

13. The test apparatus of claim 10, wherein the first probe pin includes an input probe pin and an output probe pin,
the input probe pin is configured to transmit the input signal to a first input pad of the wafer,
the output probe pin is configured to receive the output signal output from an output pad of the wafer, and
the second probe pin is configured to transmit the input signal to a second input pad of the wafer.

14. A test apparatus comprising:
an input signal applying unit configured to provide an input signal;
an output signal receiving unit configured to receive an output signal; and
a probe card configured to transmit the input signal, provided from the input signal applying unit, to a wafer, and to transmit the output signal, output from the wafer, to the output signal receiving unit,
wherein the probe card includes:
at least one input stage configured to receive the input signal;
at least one output stage configured to transmit the output signal;
a first probe input pin configured to be capable of contacting a first input pad of the wafer, wherein the first probe input pin has a first height;
a first probe output switch configured to be, capable of contacting a first output pad of the wafer, wherein the first probe output pin has the first height;
a second probe output pin configured to be capable of contacting a second other output pad of the wafer, wherein the second probe output pin has a second height that is smaller than the first height; and
a second output switch configured to electrically connect the second probe output pin to the at least one output stage, and
wherein the tester is configured to determined that the first probe input pin and the first probe output pin have become over-worn when an output signal detected through the second probe output pin is a short-circuit signal, and configured to determine that the first probe input pin and the first probe output pin are not over-worn when the output signal detected through the second probe output pin is an open signal.

15. The test apparatus of claim 14, wherein the second. probe output pin is configured to open or short-circuit a path for electrically connecting the second output pad of the wafer and the at least one output stage depending on an abrasion degree of each ends of the first probe input pin and the first probe output pin.

16. The test apparatus of claim 14, wherein
- the at least one input stage includes a first input stage configured to receive a pulse signal and a second input stage configured to receive a direct current signal,
- the at least one output stage includes a first output stage electrically connected to the first output stage and a second output stage electrically connected to the second output switch, and
- the probe card further includes:
- a first input switch configured to electrically connected the first ipput to the first probe input pin:
- a second input switch configured to electrically connect the second input stage and the first probe input pin; and
- a third output switch configured to electrically connect the second output stage to the first probe output pin.

17. The test apparatus of claim 16, wherein the test apparatus further includes a switch controller configured to transmit an operation signal to control the first and second switches and the first to third output switches.

18. The test apparatus of claim 17, wherein
- the switch controller is connected to the first input switch and the first output switch via a first transmission line, and
- the switch controller is connected to the second input switch, the second output switch, and the third output switch via a second transmission line.

* * * * *